(12) United States Patent
Xie et al.

(10) Patent No.: US 9,984,936 B1
(45) Date of Patent: May 29, 2018

(54) METHODS OF FORMING AN ISOLATED NANO-SHEET TRANSISTOR DEVICE AND THE RESULTING DEVICE

(71) Applicant: GLOBALFOUNDRIES Inc., Grand Cayman (KY)

(72) Inventors: Ruilong Xie, Niskayuna, NY (US); Siva P. Adusumilli, South Burlington, VT (US); Kangguo Cheng, Schenectady, NY (US); Pietro Montanini, Albany, NY (US); Robinhsinku Chao, Cohoes, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/651,621

(22) Filed: Jul. 17, 2017

(51) Int. Cl.
*H01L 21/8234* (2006.01)
*H01L 29/423* (2006.01)
*H01L 29/66* (2006.01)

(52) U.S. Cl.
CPC ........... *H01L 21/823481* (2013.01); *H01L 29/42392* (2013.01); *H01L 29/66545* (2013.01)

(58) Field of Classification Search
None
See application file for complete search history.

(56) References Cited

U.S. PATENT DOCUMENTS

| | | | | |
|---|---|---|---|---|
| 2013/0341704 | A1* | 12/2013 | Rachmady | H01L 29/66545 257/327 |
| 2015/0372111 | A1* | 12/2015 | Koh | B82Y 10/00 257/29 |
| 2017/0040321 | A1* | 2/2017 | Mitard | H01L 29/78684 |
| 2017/0263705 | A1* | 9/2017 | Cheng | H01L 29/0673 |
| 2017/0287788 | A1* | 10/2017 | Doris | H01L 29/785 |
| 2017/0309706 | A1* | 10/2017 | Cheng | H01L 29/66439 |
| 2017/0323949 | A1* | 11/2017 | Loubet | H01L 29/42392 |
| 2017/0323953 | A1* | 11/2017 | Cheng | H01L 29/6681 |
| 2017/0358457 | A1* | 12/2017 | Jang | H01L 21/2633 |
| 2017/0365661 | A1* | 12/2017 | Doris | H01L 29/0673 |
| 2017/0373163 | A1* | 12/2017 | Vellianitis | H01L 29/42392 |
| 2018/0006113 | A1* | 1/2018 | Cheng | H01L 29/0665 |
| 2018/0006139 | A1* | 1/2018 | Seo | H01L 29/66795 |
| 2018/0019305 | A1* | 1/2018 | Cheng | H01L 27/1203 |
| 2018/0033871 | A1* | 2/2018 | Xie | H01L 29/66795 |
| 2018/0047853 | A1* | 2/2018 | Chang | H01L 29/78696 |

* cited by examiner

Primary Examiner — Asok K Sarkar
(74) Attorney, Agent, or Firm — Amerson Law Firm, PLLC

(57) ABSTRACT

A method includes forming a sacrificial gate and a stack of materials above a semiconductor substrate, forming a trench in each of the source/drain areas of the device, wherein each trench extends into the semiconductor substrate, forming an empty space under the sacrificial gate structure, the empty space being vertically positioned between the stack of materials and the semiconductor substrate, wherein the empty space is in communication with the trenches, performing a conformal deposition process so as to deposit a conformal layer of a device isolation material adjacent at least the sacrificial gate while at least partially filling the empty space and substantially filling the trenches, and performing a recess etching process to remove at least portions of the conformal layer positioned adjacent the sacrificial gate, thereby defining a recessed upper surface of the device isolation material.

20 Claims, 23 Drawing Sheets

METHODS OF FORMING AN ISOLATED NANO-SHEET TRANSISTOR DEVICE AND THE RESULTING DEVICE

BACKGROUND OF THE INVENTION

1. Field of the Invention

The present disclosure generally relates to the fabrication of integrated circuits, and, more particularly, to various methods of forming an isolated nano-sheet transistor device and the resulting device.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nano-sheet devices, nano-wire devices, etc. A conventional FET is a planar device wherein the entire channel region of the device is formed parallel and slightly below the planar upper surface of the semiconducting substrate. In contrast to a planar FET, there are so-called 3D devices, such as a FinFET device, which is a three-dimensional structure.

FIG. 1 is a simplistic cross-sectional view of an illustrative prior art nano-sheet device 10 that is formed above a semiconductor substrate 12. FIG. 1 is a cross-sectional view that is taken through the channel region of the device 10 in a direction corresponding to the current transport direction (gate length (GL)) of the device 10. In general, the nano-sheet device 10 has a fin-type channel structure that is comprised of a plurality of vertically spaced-apart sheets of channel semiconductor material 14, e.g., silicon. A gate structure 16 for the device 10 is positioned around each of these spaced-apart layers of channel semiconductor material 14. Also depicted in FIG. 1 is a sidewall spacer 18, a gate cap 20, a plurality of inner spacers 22, source/drain regions 24, a layer of insulating material 28 and a plurality of conductive source/drain contact structures 30. Nano-sheet transistor devices show promise for advanced IC products of the future device. For example, nano-sheet devices may be formed as part of a high speed logic circuit. Typically, nano-sheet devices may be operated at a relatively low voltage, e.g., 1 V or less (based on today's technology), and they are specifically designed for high-speed operation and low-power consumption (especially for IC products that are employed in mobile devices like smartphones).

To produce such advanced IC products, product designers need transistor devices that are specifically designed to produce high drive currents while exhibiting low power consumption during operation. Unfortunately, when nano-sheet devices are made on a bulk semiconductor substrate (e.g., silicon), the area within the dashed line region 32 in FIG. 1 effectively constitutes a parasitic planar transistor that causes leakage between the source/drain regions 24. Efforts have been made to attempt to isolate the nano-sheet device 10 from the substrate 12 to reduce or eliminate this problem. For example, one option would be to heavily counter-dope the portion of the substrate 12 within the dashed line region 32. Even if such a doped region was formed, there would still be a capacitance penalty, wherein the conductive metals in the gate structure 16 would function as the upper plate of a capacitor and the doped region would constitute the lower plate of the capacitor, with the insulating material in the gate structure 16 being positioned between these two "plates."

This parasitic capacitor would charge and discharge every time the gate structure 16 is energized. Other efforts have been made to form an isolation material, e.g., silicon dioxide, between the gate structure 16 and the immediately underlying portion of the substrate 12 or forming an isolation material in a recess formed in the substrate 12 between adjacent devices 10. However, such efforts involve complex processing steps which increase manufacturing time and may lead to reduced product yields. What is needed is an efficient and effective means of producing a fully isolated nano-sheet device.

The present disclosure is directed to various novel methods of forming an isolated nano-sheet transistor device and the resulting novel device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming an isolated nano-sheet transistor device and the resulting novel device. One illustrative method disclosed herein includes, among other things, forming a sacrificial gate and a stack of materials above a semiconductor substrate, wherein the sacrificial gate is positioned above the stack of materials and wherein the stack of materials comprises at least one channel semiconductor material layer and a plurality of first layers of a sacrificial material, and then forming a trench in each of the source/drain areas of the device, wherein each trench extends into the semiconductor substrate. In this example, the method may also include forming an empty space under the sacrificial gate structure, the empty space being vertically positioned between the stack of materials and the semiconductor substrate, wherein the empty space is in communication with the trenches, performing a conformal deposition process so as to deposit a conformal layer of a device isolation material adjacent at least the sacrificial gate while at least partially filling the empty space with the device isolation material and substantially filling the trenches with the device isolation material, and performing a recess etching process to remove at least portions of the conformal layer of the device isolation material positioned adjacent the sacrificial gate, thereby defining a recessed upper surface of the device isolation material.

BRIEF DESCRIPTION OF THE DRAWINGS

The disclosure may be understood by reference to the following description taken in conjunction with the accompanying drawings, in which like reference numerals identify like elements, and in which.

Figure 1:
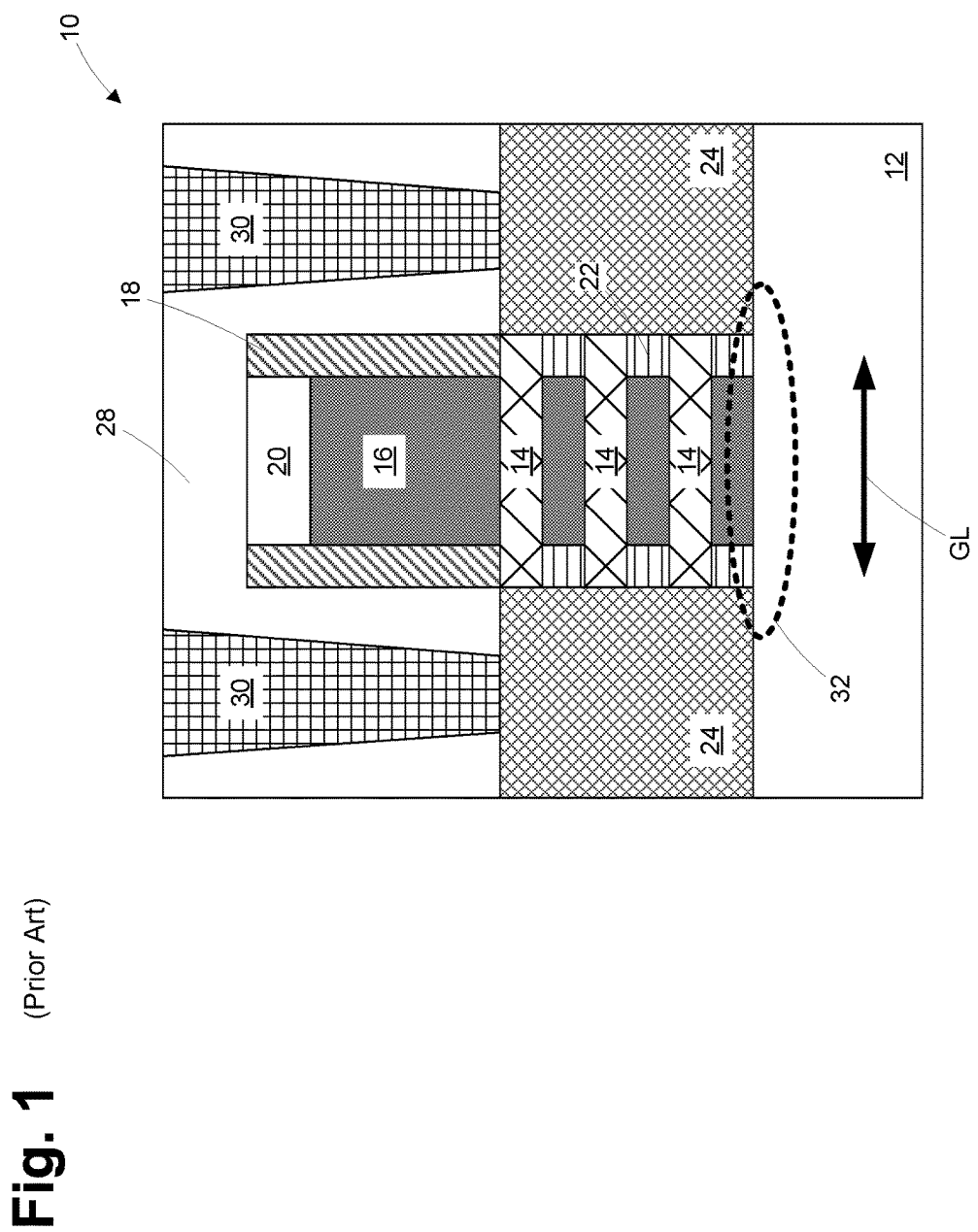
FIG. 1 depicts an illustrative prior art nano-sheet transistor.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The methods and devices disclosed herein may be employed in manufacturing IC products using a variety of technologies, e.g., NMOS, PMOS, CMOS, etc., and they may be employed in manufacturing a variety of different products, e.g., memory products, logic products, ASICs, etc. The gate structure of the nano-sheet transistor devices 100 disclosed herein may be formed using "replacement gate" manufacturing techniques. Of course, the inventions disclosed herein should not be considered to be limited to the illustrative examples depicted and described herein. As will be appreciated by those skilled in the art after a complete reading of the present application, various doped regions, e.g., source/drain regions, halo implant regions, well regions and the like, are not depicted in the attached drawings. The various components and structures of the devices 100 disclosed herein may be formed using a variety of different materials and by performing a variety of known techniques, e.g., a chemical vapor deposition (CVD) process, an atomic layer deposition (ALD) process, a thermal growth process, epi deposition, spin-coating techniques, etc. With reference to the attached figures, various illustrative embodiments of the methods and devices disclosed herein will now be described in more detail.

FIGS. 2-14 depict various novel methods disclosed herein for forming an isolated nano-sheet transistor device and the resulting novel device. In the examples depicted herein, two illustrative nano-sheet transistor devices 100 will be formed in and above a semiconductor substrate 102. The substrate 102 may have a variety of configurations, such as the depicted bulk silicon configuration. The substrate 102 may be made of silicon or it may be made of materials other than silicon. Thus, the terms "substrate" or "semiconductor substrate" should be understood to cover all semiconducting materials and all forms of such materials.

Figure 2:
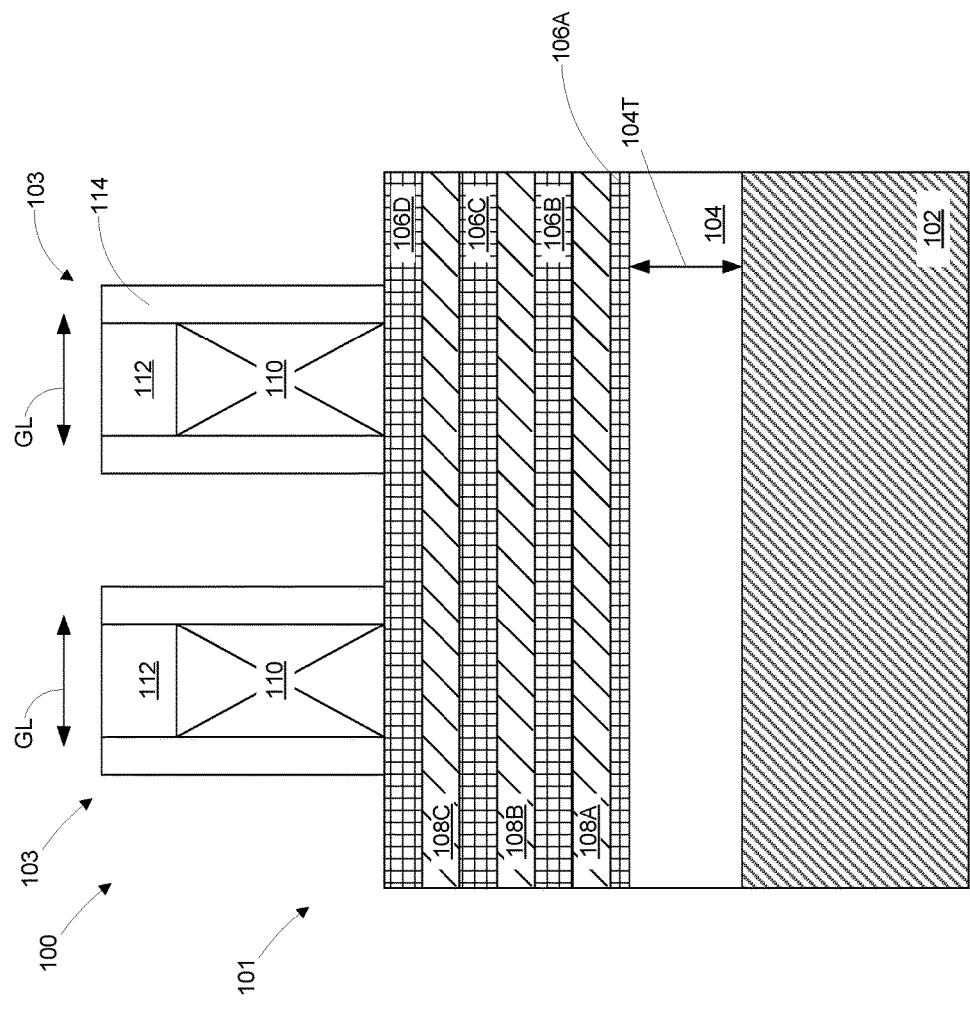
FIGS. 2-14 depict various novel methods disclosed herein of forming an isolated nano-sheet transistor device and the resulting novel device.
Figure 3:
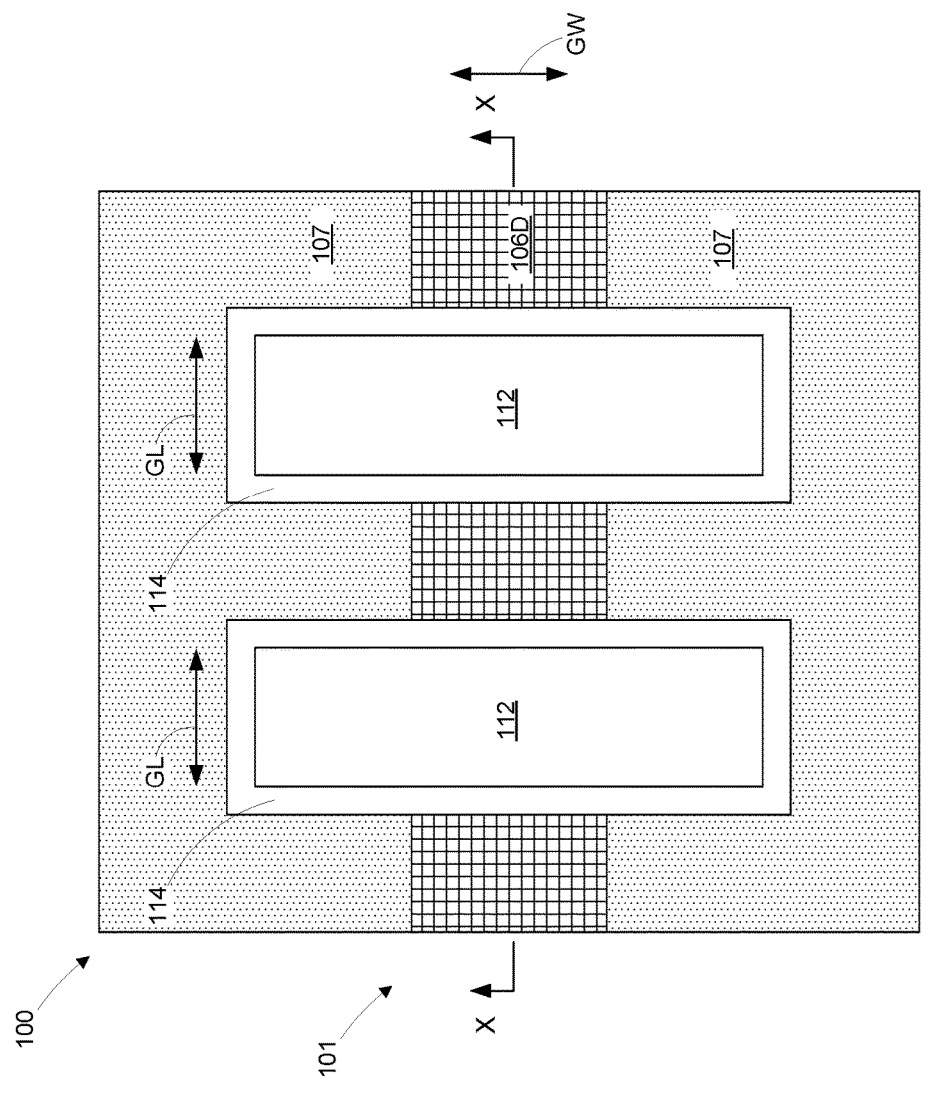

FIGS. 2 and 3 are, respectively, a simplistic cross-sectional view and a simplistic plan view of one illustrative embodiment of an integrated circuit product that comprises two of the nano-sheet devices 100 at a relatively early stage of fabrication. FIG. 2 is a cross-sectional view that is taken through the channel regions of the devices 100 in a direction that corresponds to the current transport (or gate length (GL)) direction of the devices 100, i.e., the view X-X depicted in FIG. 3. FIG. 3 depicts what will become the gate length (GL—current transport) direction of the final devices 100 as well as the gate width (GW) direction of the final devices 100.

FIGS. 2 and 3 depict the devices 100 after several process operations were performed. First, several layers of material were sequentially formed across substantially the entire substrate 102 by performing multiple epitaxial growth processes to define a stack of epi semiconductor materials. Thereafter, one or more etching processes, e.g., anisotropic etching processes, were performed through a patterned etch mask (not shown) to pattern the originally deposited stack of epi semiconductor materials so as to form an elongated stack 101 of the epi semiconductor materials (the layers 104, 106A-D and 108A-C described more fully below). At this point in the process flow, the elongated stack 101 of the epi semiconductor materials has a general fin-like configuration (see FIG. 3) when viewed from above. This patterning operation results in the formation of a plurality of trenches (not shown) that extend into the substrate 102 on opposite sides of the elongated stack 101 of materials. With reference to FIG. 3, after the formation of the elongated stack 101 of epi semiconductor materials, a layer of insulating material 107 (e.g., silicon dioxide) was deposited so as to overfill the trenches that were defined in the substrate 102 when the epi semiconductor materials were patterned. Thereafter, a chemical mechanical polishing (CMP) process was performed to planarize the upper surface of the layer of insulating material 107 with the upper surface of the patterned etch mask. Then, a recess etching process was performed on the layer of insulating material 107 to reduce its thickness within the trenches such that sides of all of the layers of material in the elongated stack 101 of epi semiconductor materials are exposed. At that point, the patterned etch mask was removed by performing one or more etching or stripping processes.

In this depicted example, the devices 100 comprise a first sacrificial material layer 104, a plurality of second sacrificial material layers 108A-C (collectively referenced by use of the numeral 108) and a plurality of channel semiconductor material layers 106A-D (collectively referenced by use of the numeral 106). As depicted, the layers 106 and 108 are interleaved with one another. If desired, the channel semiconductor layer 106A may be omitted. In this particular embodiment, for reasons that will be described more fully below, the first sacrificial material layer 104 should be made of a material that may be selectively removed (by etching) relative to both the second sacrificial material layers 108 and the channel semiconductor material layers 106. Similarly, for reasons that will be described more fully below, the second sacrificial material layers 108 should be made of a material that may be selectively removed (by etching) relative to the channel semiconductor material layers 106. When the devices 100 are completed, portions of the channel semiconductor material layers 106B-D will constitute the channel structure for the devices 100. In one illustrative embodiment, the first sacrificial material layer 104 may be comprised of silicon germanium (SiGe) with a first germanium concentration while the layers 108 may be comprised of silicon germanium (SiGe) with a second germanium concentration that is different than the first germanium concentration, so as to permit selective etching of the layers 104 and 108 relative to one another. In one particular embodiment, the first sacrificial material layer 104 may be comprised of $Si_{x1}Ge_{y1}$ and the second sacrificial material layers 108 may be comprised of $Si_{x2}Ge_{y2}$ (where $x_1+y_1=1$; $x_2+y_2=1$; $x_1>0$; $x_2>0$ and $y_1>y_2$ or $y_1<y_2$). In an even more specific illustrative embodiment, the first sacrificial material layer 104 may be comprised of a material such as, for example, $Si_{(0.50)}Ge_{(0.50)}$, the second sacrificial material layers 108 may be made of a material such as, for example, $Si_{(0.75)}Ge_{(0.25)}$, and the channel semiconductor material layers 106 may be made of, for example, substantially pure silicon. Of course, other materials may be used for the layers 104, 106 and 108 instead of the illustrative materials mentioned above.

The number and thickness of the layers 104, 106 and 108 within the stack 101 of materials may vary depending upon the particular application. In the example depicted herein, the devices 100 comprise three of the channel semiconductor material layers 106. However, in practice, the devices 100 could be formed with any desired number of channel semiconductor material layers 106, even including a single channel semiconductor material layer 106 (that is positioned between two second sacrificial material layers 108 during the manufacturing process) for a gate-all-around device 100. Additionally, when the stack 101 of materials 101 includes multiple second sacrificial material layers 108, all of the second sacrificial material layers 108 within the stack 101 of materials need not be formed to the same thickness, although that may be the case in some applications. Similarly, when the stack 101 of materials includes multiple channel semiconductor material layers 106, all of the channel semiconductor material layers 106 within the stack 101 of materials need not be formed to the same thickness, although that may be the case in some applications. In the specific illustrative example depicted herein, the first sacrificial material layer 104 may be formed with an initial thickness 104T of about 6-40 nm, all of the second sacrificial material layers 108 may be formed with the same initial thickness of about 8-20 nm, the channel semiconductor material layers 106B-D may all be formed with the same initial thickness of about 4-10 nm, and the layer 106A (which is optional) may be formed to a relatively lesser thickness, e.g., about 1-3 nm. The thicknesses selected for the various layers of material 104, 106 and 108 may vary from application to application for a variety of reasons. For example, in some cases, the thicknesses of the layers (considered individually and collectively) may be selected such that the overall height of the stack 101 of materials is approximately the same as other structures for other devices, e.g., FinFET devices, that are formed above the same substrate 102 so as to make subsequent manufacturing steps, such as CMP processes, easier to perform.

With continuing reference to FIGS. 2 and 3, the width and height of the elongated stack 101 of materials may vary depending upon the particular application. Additionally, the overall size, shape and configuration of the trenches formed in the substrate 102 and the elongated stack 101 of materials may vary depending on the particular application. In the illustrative examples depicted in the attached drawings, the elongated stack 101 of materials is depicted as having been formed by performing an anisotropic etching process that results in the elongated stack 101 of materials having a schematically (and simplistically) depicted, generally rectangular configuration. In an actual real-world device, the sidewalls of the elongated stack 101 of materials may be somewhat outwardly tapered (i.e., the elongated stack 101 of materials may be wider at the bottom of the stack 101 than they are at the top of the stack 101), although that configuration is not depicted in the attached drawings. Thus, the size and configuration of the elongated stack 101 of materials, and the manner in which it is made, should not be considered a limitation of the present invention. For ease of disclosure, only the substantially rectangular elongated stack 101 of materials will be depicted in the subsequent drawings.

With continuing reference to FIGS. 2 and 3, in the illustrative examples depicted herein, the final gate structures for the devices 100 will be manufactured using replacement gate manufacturing techniques. Accordingly, FIGS. 2 and 3 depict the devices 100 after a schematically depicted plurality of sacrificial gates 103 were formed on the stack 101 of materials. Each of the sacrificial gates 103 comprises a sacrificial gate structure 110, a gate cap 112 and a sidewall spacer 114. The sacrificial gate structures 110 may be comprised of a gate insulation layer (not separately shown), e.g., silicon dioxide, and a sacrificial gate electrode (not separately shown) comprised of, for example, amorphous silicon. The sacrificial gate structures 110 and the gate cap 112 may be formed by performing known deposition, masking and etching techniques. The sidewall spacers 114 may be formed by performing a conformal deposition process to form a conformal layer of spacer material above the sacrificial gate structures 110, the gate caps 112 and the rest of the substrate 102, and thereafter performing an anisotropic etching process. The sidewall spacers 114 and the gate caps 112 may be comprised of a variety of different materials, such as silicon nitride, SiBNC, SiNC, SiN, SiCO, and SiNOC, etc., and they may be made of the same or different materials. In one particularly illustrative embodiment, the sidewall spacers 114 and the gate caps 112 may be made of a material (e.g., SiBCN) that exhibits good etch selectivity to the materials (e.g., SiN) used for the inner spacers that will be formed on devices 100, as described more fully below.

Figure 4:
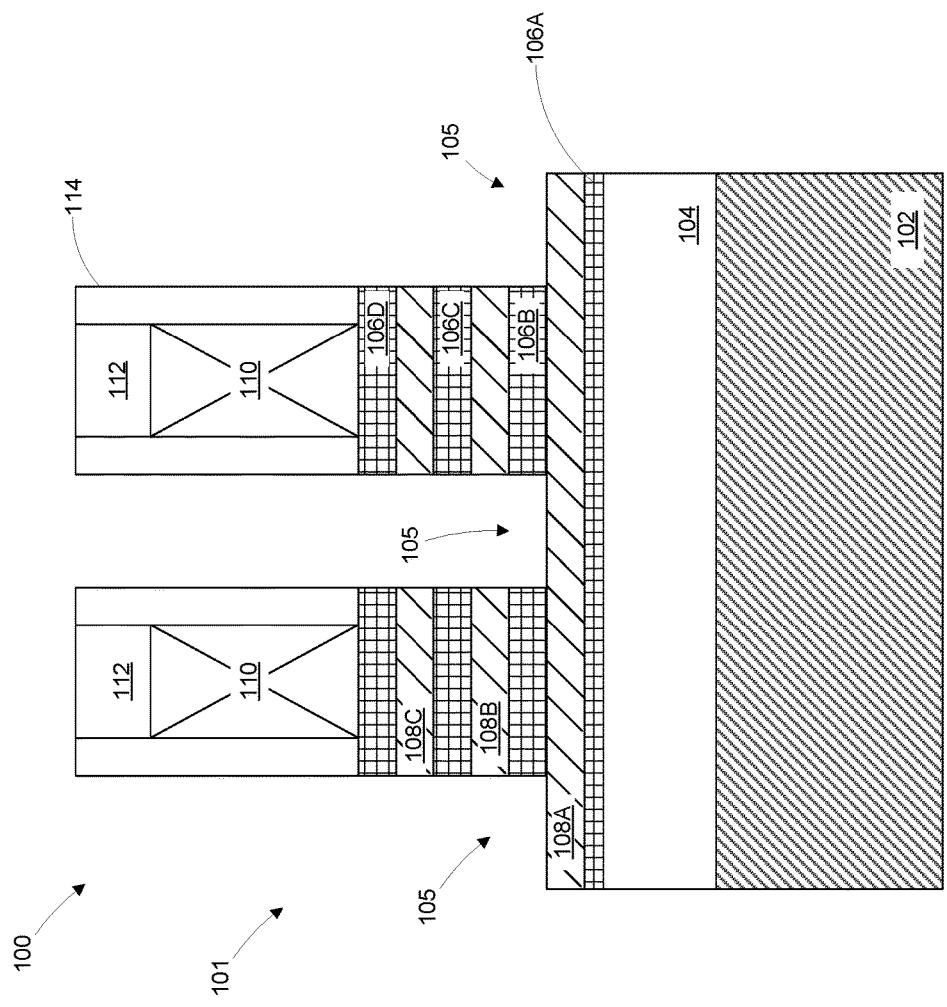

FIG. 4 depicts the devices 100 after several process operations were performed. First, one or more etch processes were performed using the gates 103 as an etch mask. During these process operations, all of the non-covered portions of the layers of material in the elongated stack 101 of materials above the lowermost second sacrificial material layer 108A are removed. As depicted, the lowermost second sacrificial material layer 108A remains in position above the areas 105 where source/drain regions will be formed for the devices. In one embodiment, the etching processes may be anisotropic etching processes. As depicted in FIG. 4, these etching processes are substantially self-aligned with respect to the spacers 114.

Figure 5:
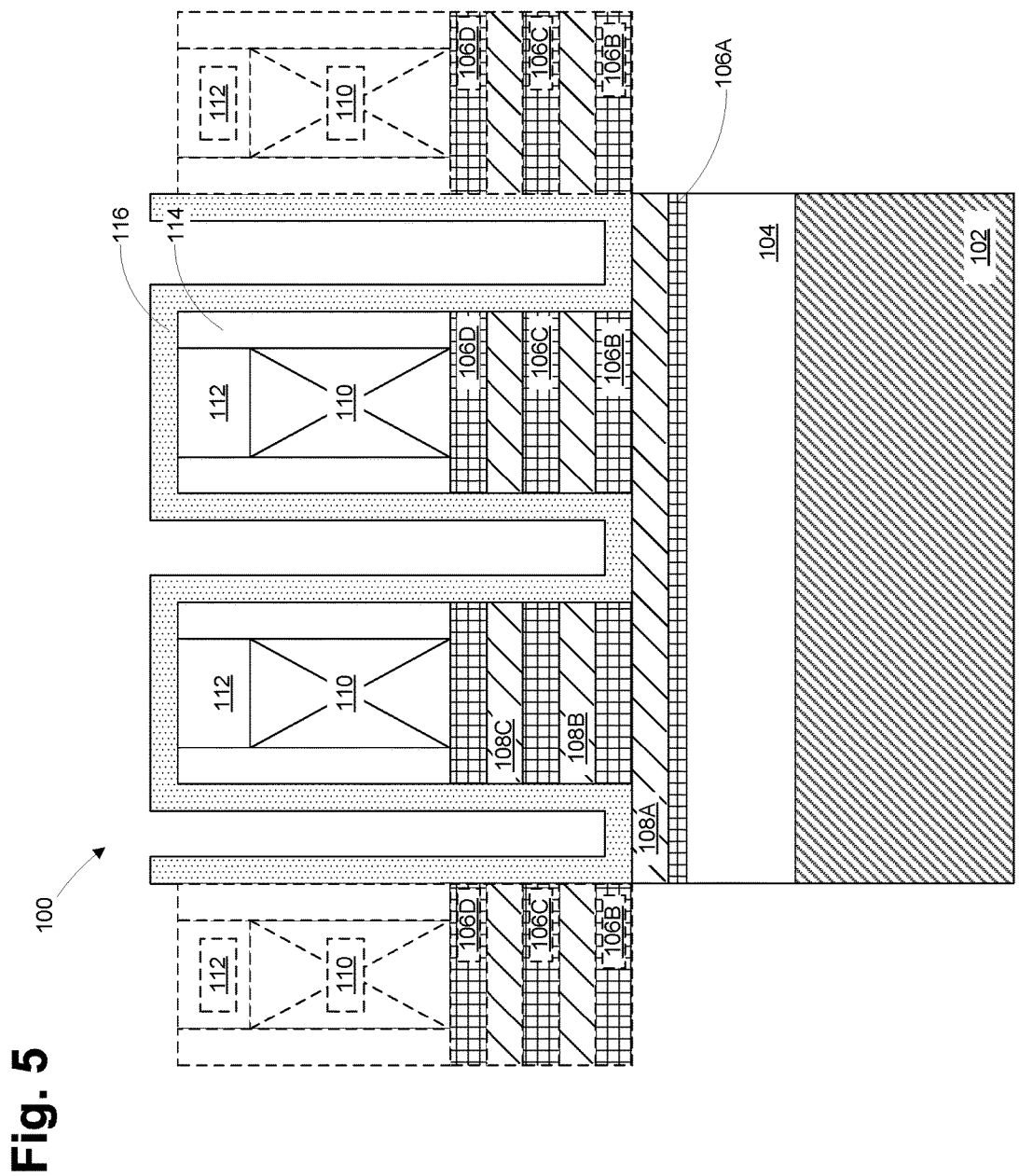

FIG. 5 depicts the devices 100 after a conformal deposition process, e.g., an ALD process, was performed to form a sacrificial conformal layer 116 across the product. The sacrificial conformal layer 116 may be comprised of a variety of materials, e.g., silicon dioxide, SiON, SiCO, etc. FIG. 5 also depicts two additional gates 103 (shown in dashed lines) for additional devices that are formed on the substrate 102 so as to show the true conformal nature of the sacrificial conformal layer 116. These additional gates will not be shown in any other drawings. The sacrificial conformal layer 116 may be formed to any desired thickness, and its thickness may vary depending upon a variety of factors such as, for example, the gate pitch selected for the product and the spacing between the spacers 114 on adjacent gate structures 110. In one illustrative example, the sacrificial conformal layer 116 may have a thickness that is slightly less than the thickness of the sidewall spacers 114, e.g., the spacers 114 may have a thickness of about 6 nm, while the sacrificial conformal layer 116 may have a thickness of about 4 nm.

Figure 6:
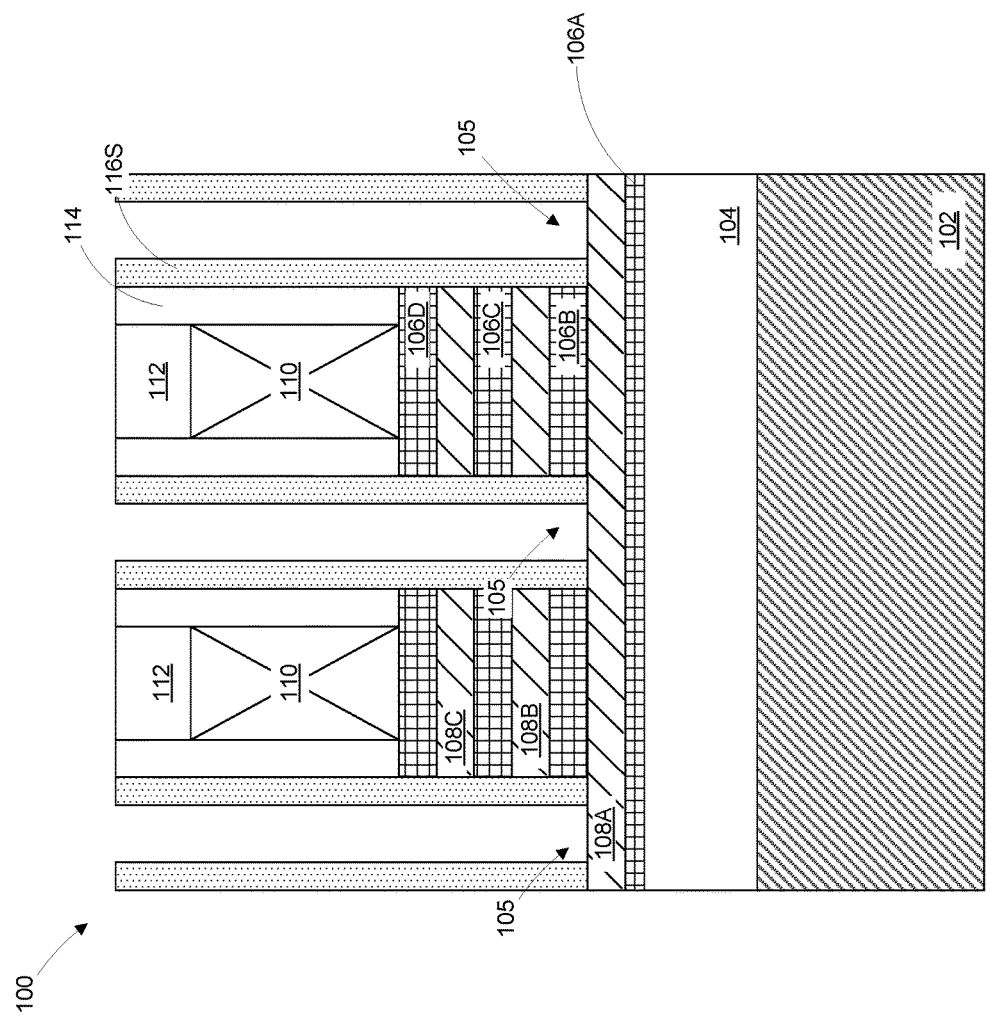

FIG. 6 depicts the devices 100 after an anisotropic etching process was performed on the sacrificial conformal layer 116. This results in the formation of sacrificial spacers 116S adjacent the gate structures 110, adjacent the patterned layers 106B-106D, adjacent the patterned layers 108B-C and above the lowermost second sacrificial material layer 108A. As depicted, this process operation exposes portions of the lowermost second sacrificial material layer 108A that are positioned above the areas 105 where source/drain regions will be formed for the devices.

Figure 7:
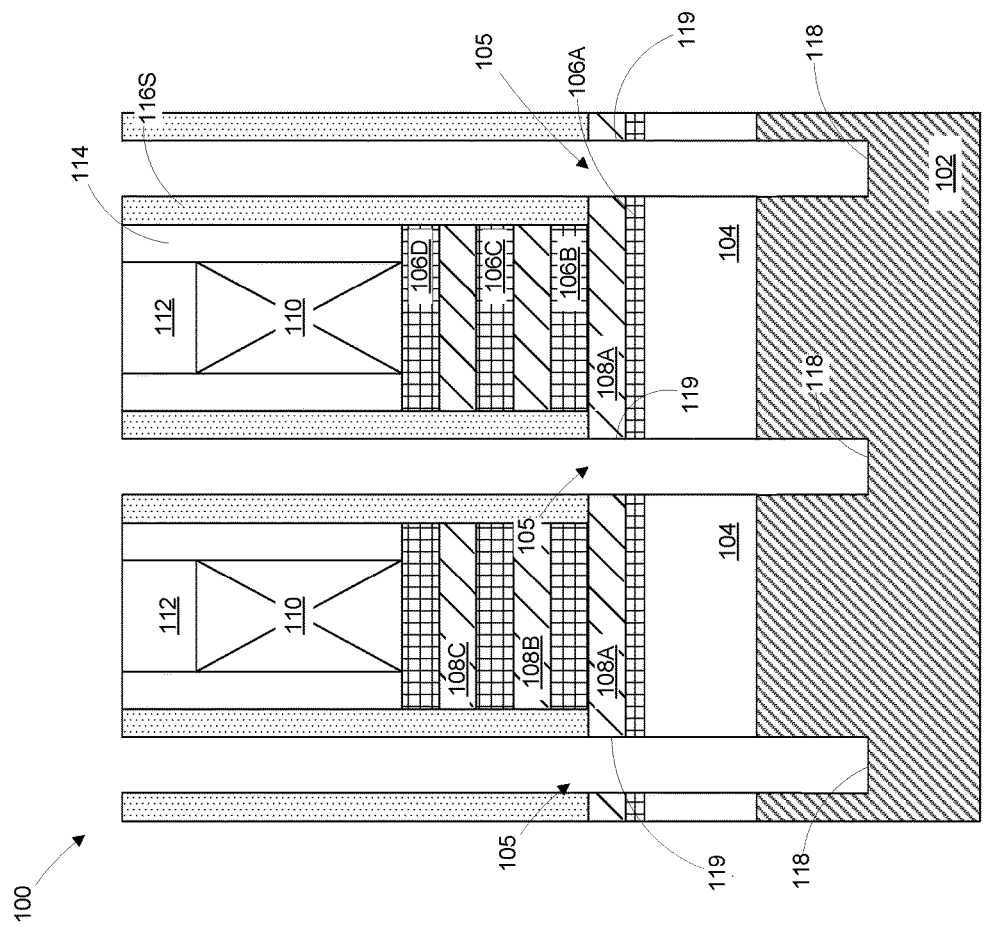
Figure 8:
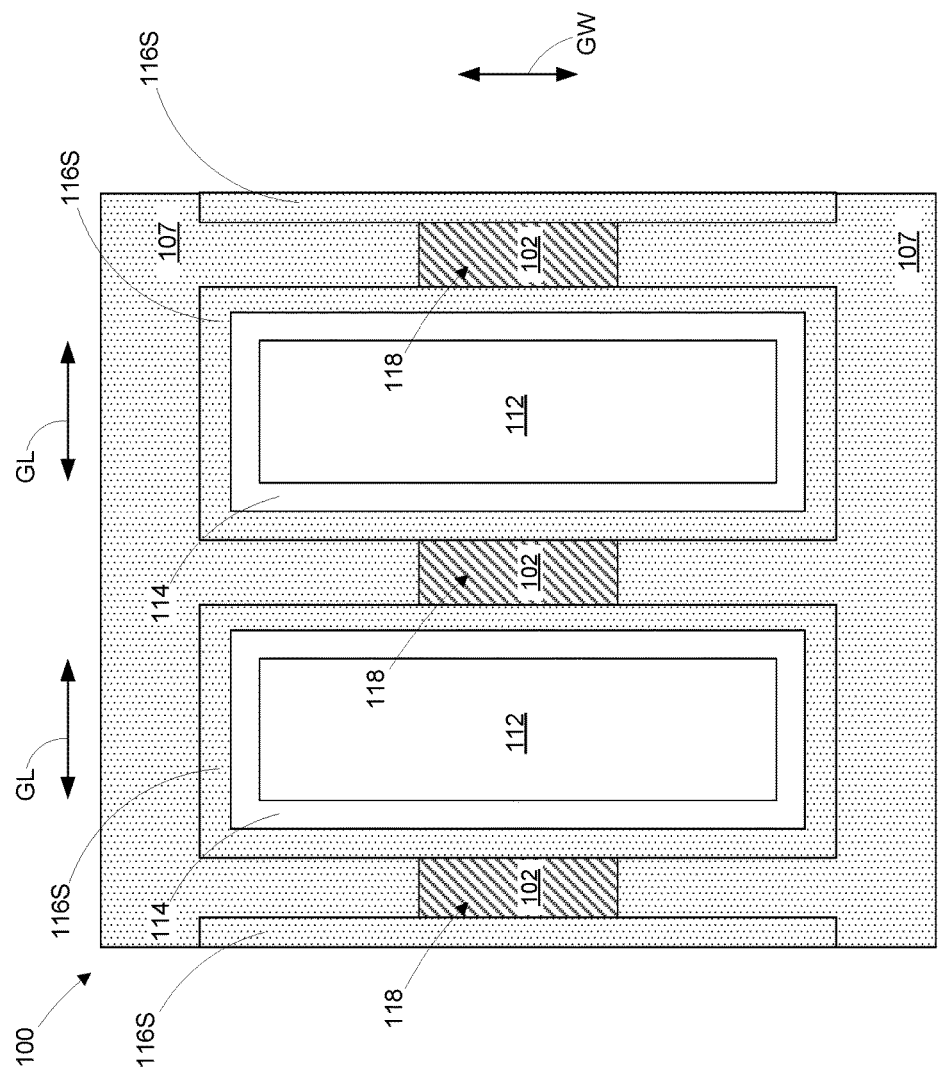

FIG. 7 (cross-sectional view) and FIG. 8 (plan view) depict the devices 100 after one or more etching processes were performed to define a plurality of trenches 118 in the areas 105 where source/drain regions will be formed for the devices 100. Forming the trenches 118 involves removal of portions of the lowermost second sacrificial material layer 108A, the layer of material 106A, the first sacrificial material layer 104 and the substrate 102 that are positioned below the area between the sacrificial spacers 116S. These process operations define a plurality of trenches 118 in the substrate 102 on opposite sides of each of the gate structures 110. As depicted, these trenches extend from an opening 119 in the lowermost second sacrificial material layer 108A and into the substrate 102. As shown in FIG. 8, in this particular example, the trenches have a generally rectangular configuration when viewed from above with a long axis that extends in the gate width (GW) direction of the device 100 and a short axis that extends in the gate length (GL) direction of the devices. The first sacrificial material layer 104 is exposed within the trenches 118.

Figure 9:
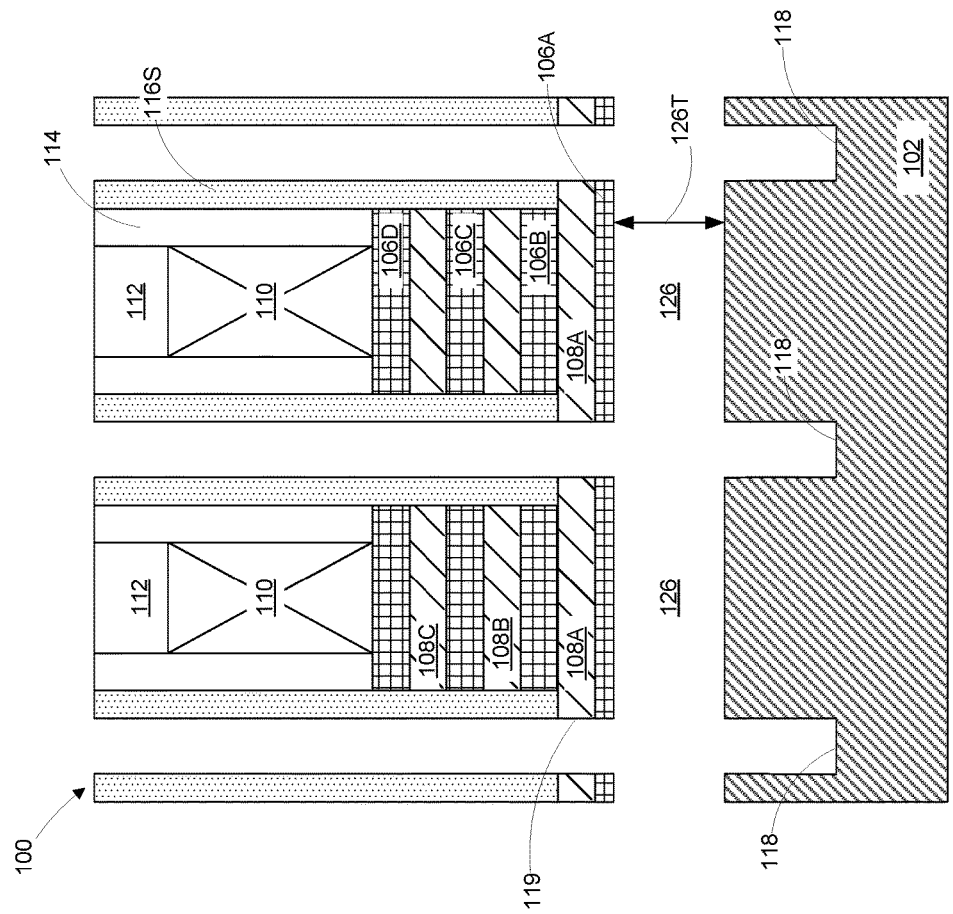

FIG. 9 depicts the devices 100 after a selective isotropic etching process was performed through the opening 119 in the lowermost second sacrificial material layer 108A, i.e., through the trenches 118, to selectively remove substantially all of the first sacrificial material layer 104 relative to the surrounding materials, including the lowermost second sacrificial material layer 108A and the optional material layer 106A. This process operation results in the formation of a plurality of empty spaces 126, each of which extends laterally under the channel materials 106 of its associated device 100 in both the gate length (GL) direction (shown in FIG. 9) and the gate width direction (GW) of the devices 100. As depicted, the empty spaces 126 have a thickness or height 126T that corresponds to the initial thickness of the first sacrificial material layer 104. Also note that the empty spaces 126 are in communication with the trenches 118 previously defined in the substrate 102.

Figure 10:
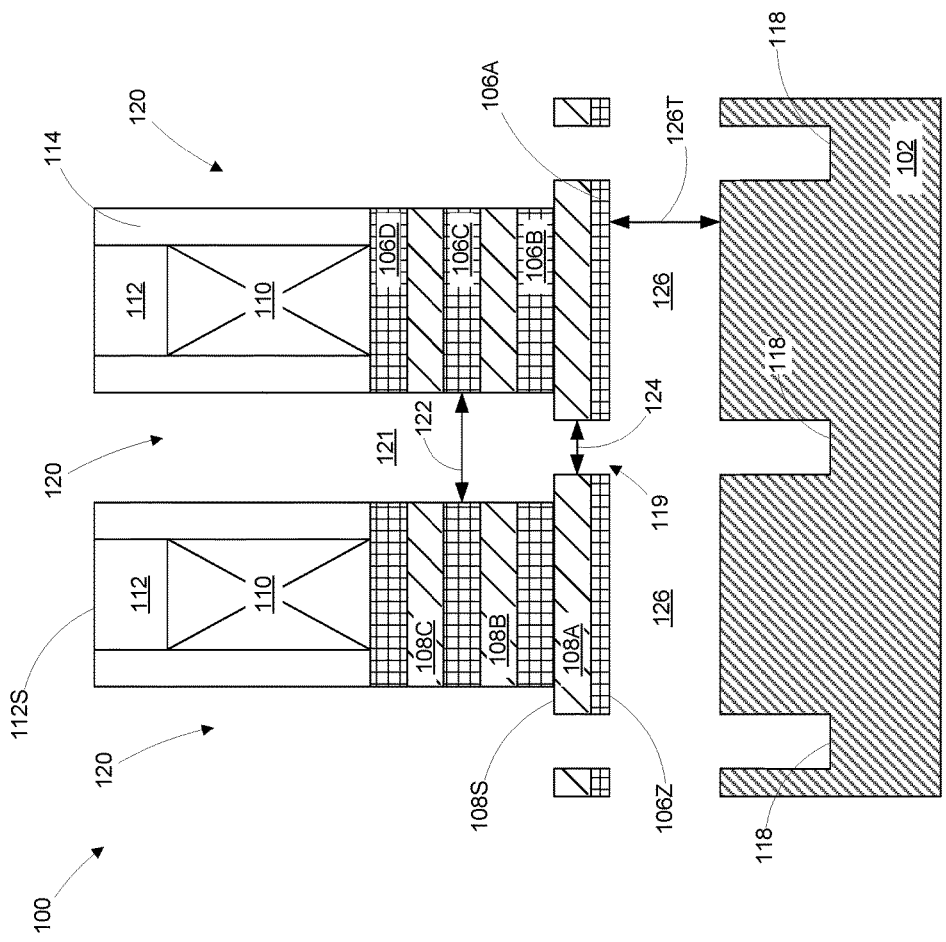

FIG. 10 depicts the devices 100 after an etching process was performed to selectively remove the sacrificial spacers 116S relative to the surrounding materials. This process re-exposes portions of the lowermost second sacrificial material layer 108A. As depicted, at this point, an opening 120 having a stepped (or dual sized) configuration (with an upper opening 121 and a lower opening 119) is formed between the devices 100 (or on both sides of a single device). The upper opening 121 of the stepped opening 120 (extending from the upper surface 108S of the lowermost second sacrificial material layer 108A to the upper surface of the channel semiconductor material layer 106D) has a nominal lateral width 122, which may vary depending upon the particular application (e.g., 16-25 nm). The lower opening 119 of the stepped opening 120 (extending from the upper surface 108S of the lowermost second sacrificial material layer 108A to the bottom surface 106Z of the layer of material 106A) has a nominal lateral width 124, which may vary depending upon the particular application (e.g., 8-15 nm). Importantly, the width 124 of the lower opening 119 is less than the width 122 of the upper opening 121 portion of the stepped opening 120. In one illustrative embodiment, the width 124 of the lower opening 119 portion of the stepped opening 120 may be about 6-8 nm less than the width 122 of the upper opening 121 portion of the stepped opening 120.

Figure 11:
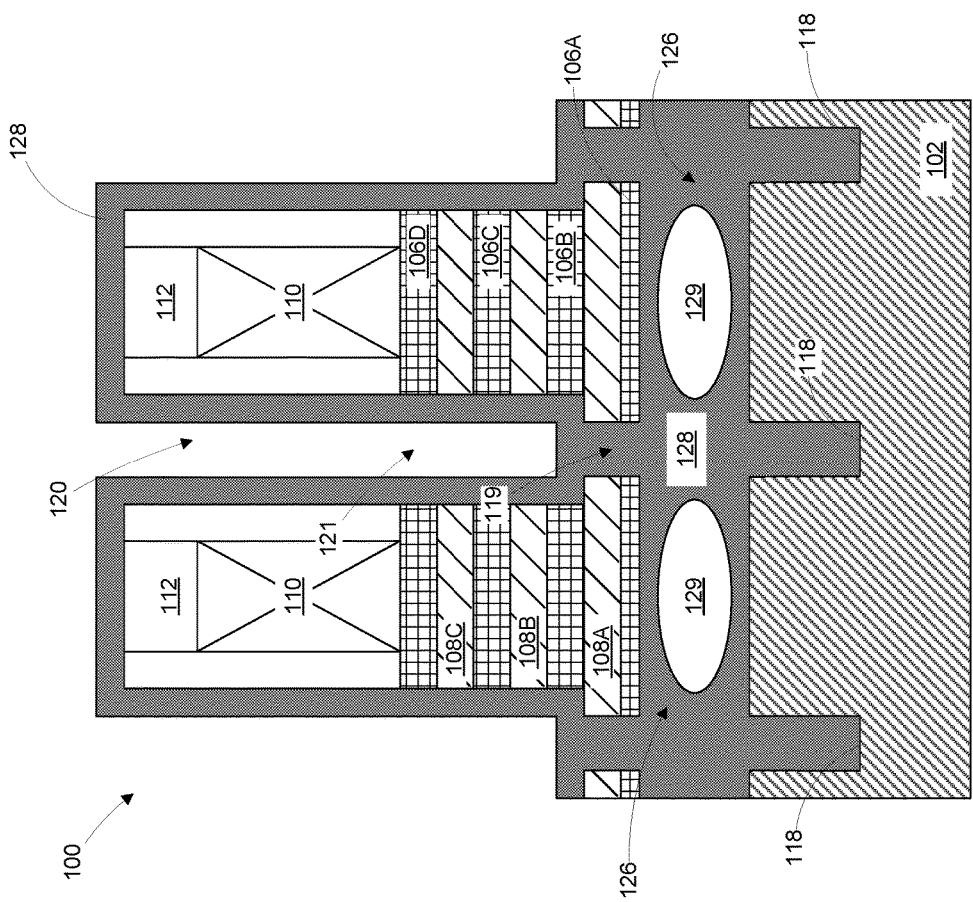

FIG. 11 depicts the devices 100 after a conformal deposition process, e.g., an ALD process, was performed to form a conformal layer of device isolation material 128 across the product, in the empty cavities 126 between the devices and the substrate 102 and in the trenches 118 that extend into the substrate 102. The conformal layer of isolation material 128 may be comprised of a variety of insulating materials, e.g., silicon nitride, SiBNC, SiNC, SiN, SiCO, and SiNOC, etc. In one particularly illustrative embodiment, the conformal layer of isolation material 128 may be made of a material (e.g., SiBCN) that exhibits good etch selectivity to the materials (e.g., SiN) used for the inner spacers that will be formed on the devices 100, as described more fully below. Note that, due to the relatively narrow lateral width 124 (see FIG. 10) of the lower opening 119 portion of the stepped opening 120 as compared to the wider width 122 of the upper opening 121, the material of the conformal layer of isolation material 128 will "pinch off" (or fill) the lower opening 119 portion of the stepped opening 120 while the conformal layer of isolation material 128 retains its substantially conformal configuration and does not fill, to any significant extent, the upper opening 121. With continued reference to FIG. 11, due to the fact that, in this particular embodiment, the initial thickness 104T of the layer of first sacrificial material layer 104 (which corresponds to the thickness 126T of the spaces 126) was greater than the lateral width 124 of the lower opening 119, the conformal layer of isolation material 128 does not completely fill the spaces 126. As a result, simplistically depicted air gaps 129 are formed under the channel regions of the devices 100. The physical size of the air gaps 129 and their physical configuration may vary depending upon the particular application. However, in general, if the initial thickness 104T of the layer of first sacrificial material layer 104 is greater than the lateral width 124, then air gaps 129 will form under the devices in the spaces 126. The physical size of the air gaps 129 (in both vertical and lateral directions) depends on, to at least some degree, how large is the difference between the thickness 104T and the lateral width 124. In general, as this thickness difference gets larger, the physical size of the air gaps 129 also increases. Given the relatively larger width 122 of the upper opening 121, the conformal layer of isolation material 128 retains its substantially conformal configuration and does not fill, to any significant extent, the upper opening 121.

Figure 12:
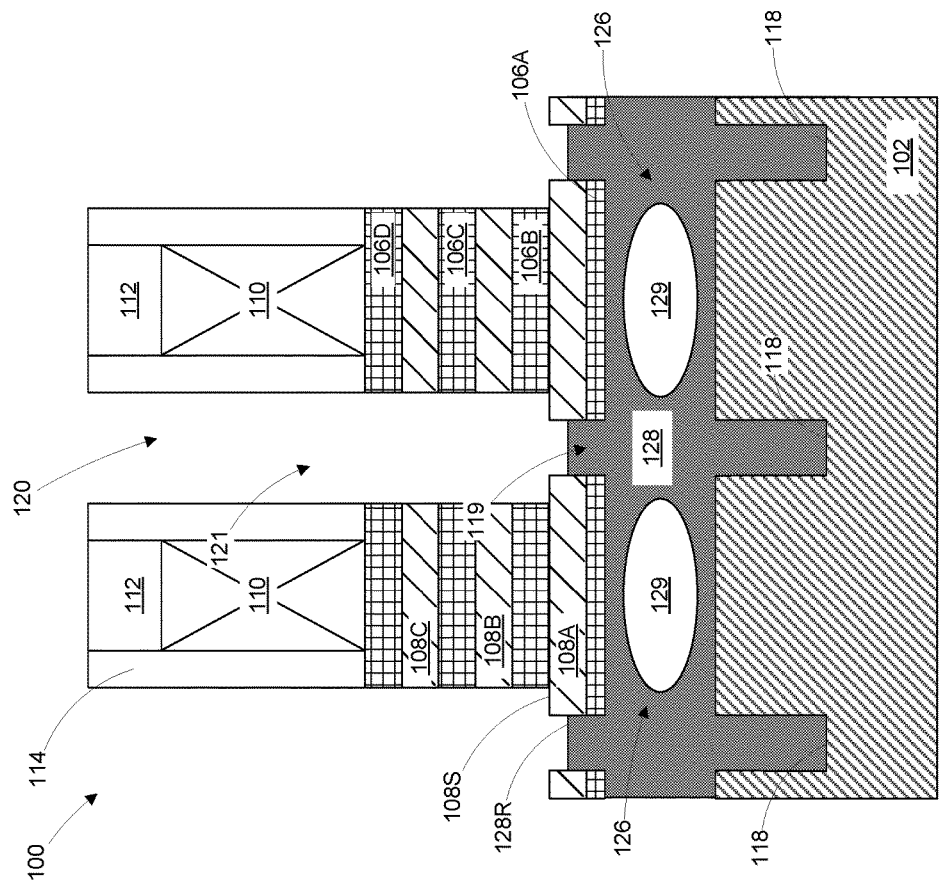
Figure 13:
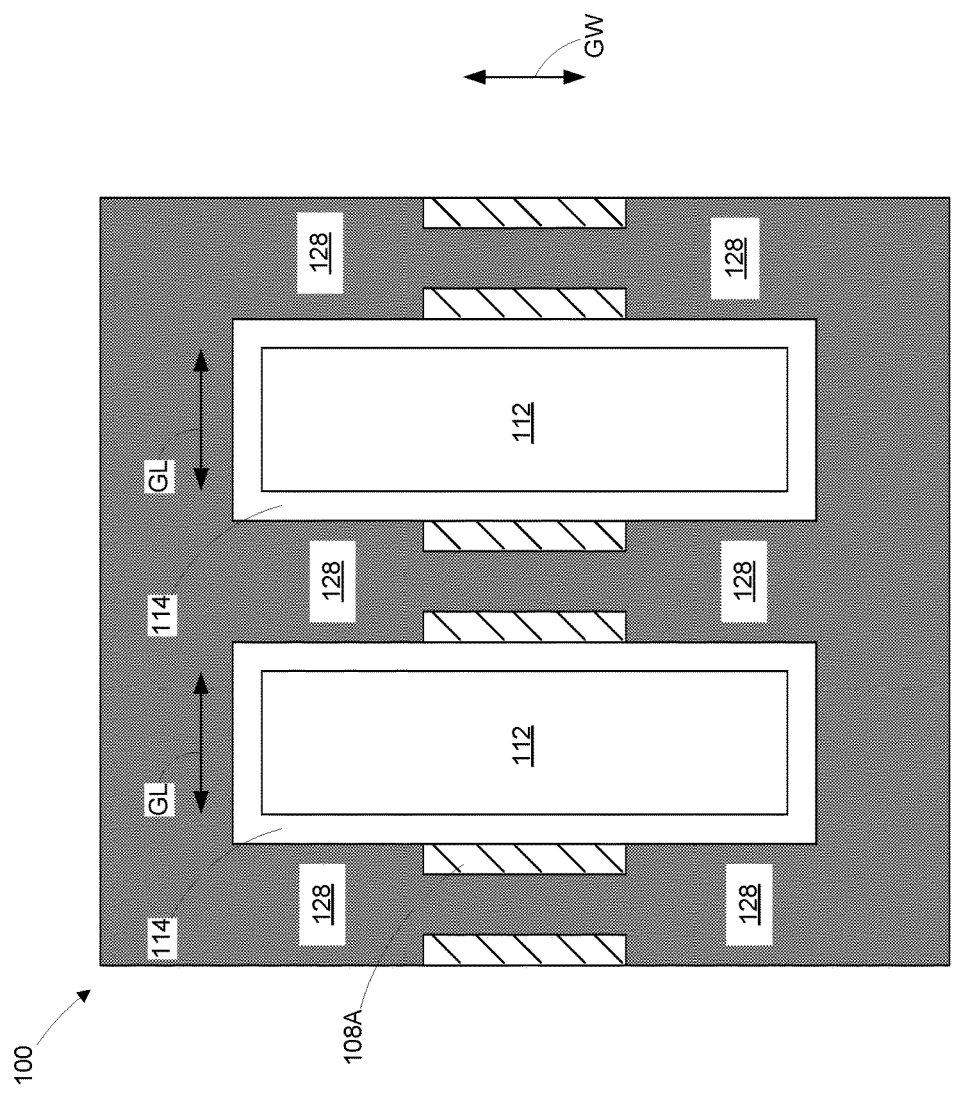

FIG. 12 (side view) and FIG. 13 (plan view) depict the devices 100 after a timed, isotropic recess etching process was performed on the conformal layer of device isolation material 128. As depicted, at the completion of the recess etching process, the conformal layer of device isolation material 128 has a recessed upper surface 128R that is positioned at a level that is below the level of the upper surface 108S of the lowermost second sacrificial material layer 108A. The amount of recessing of the conformal layer of isolation material 128 may vary depending upon the particular application. However, in one embodiment, the conformal layer of isolation material 128 was recessed a sufficient amount such that at least a portion of the lowermost second sacrificial material layer 108A is exposed for further processing. As depicted, performing the processing flow described above results in the formation of a plurality of fully isolated nano-sheet devices 100 in that the isolation material 128 is positioned under the devices 100 and between the substrate 102 (with the air gaps 129 in position under the devices 100) and the isolation material 128 extends into the trenches 118 in the substrate 102 and the isolation material extends around the perimeter (when viewed from above) of the devices 100 above the isolation material 107 (see FIG. 3). At the point of processing depicted in FIGS. 12-13, additional manufacturing techniques may be performed to complete the devices 100.

Figure 14:
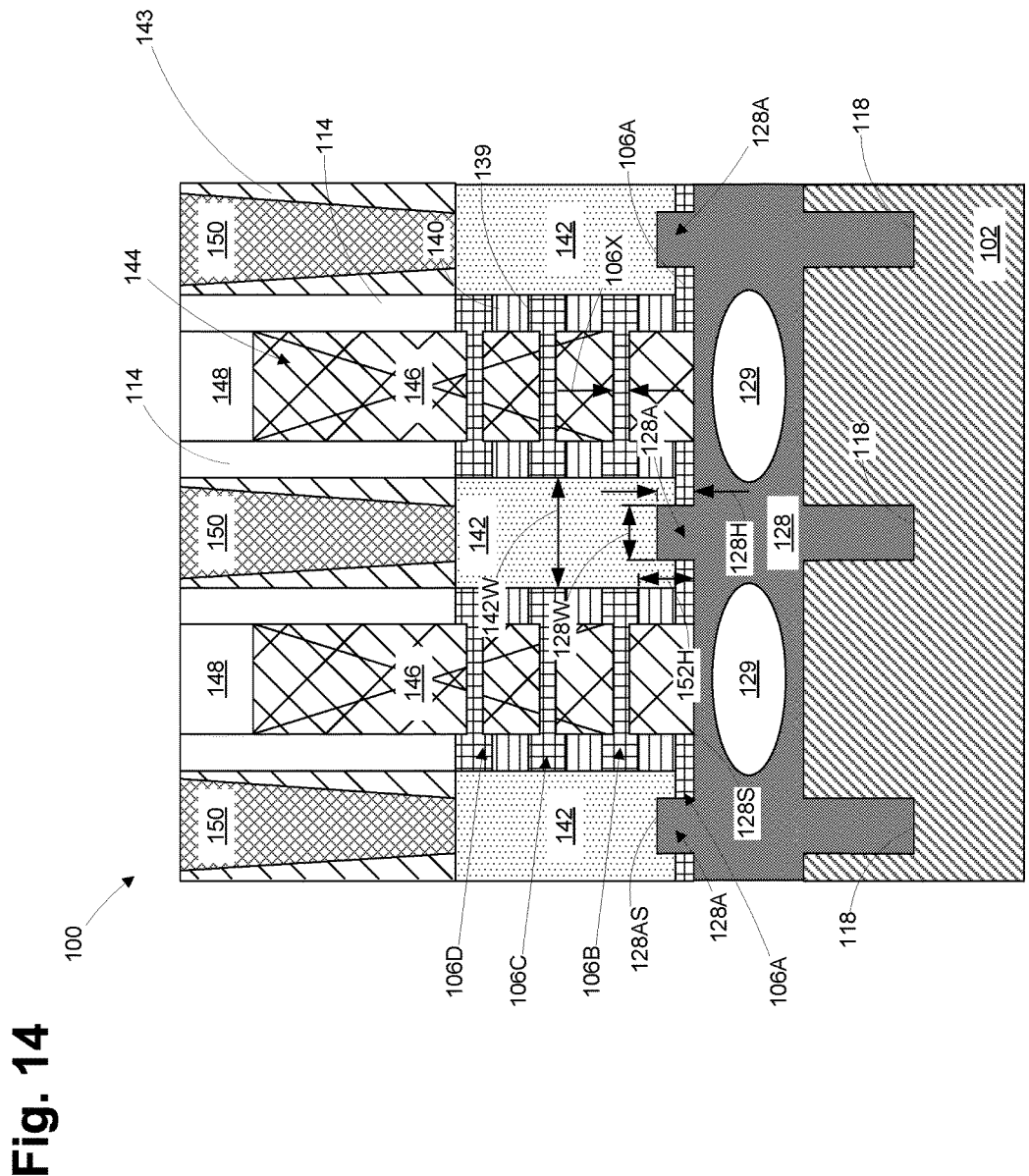

FIG. 14 depicts the devices 100 after several operations were performed to substantially complete the formation of the devices 100. In one illustrative process flow, an anisotropic etching process was performed to remove the portions of the lowermost second sacrificial material layer 108A such that, after this anisotropic etching process, the edges of all of the second sacrificial material layers 108 are substantially self-aligned with respect to the sidewall spacers 114. Thereafter, a timed isotropic etching process was performed to partially recess the lateral width of all of the second sacrificial material layers 108 selectively relative to the channel semiconductor material layers 106. That process results in the formation of a plurality of inner spacer cavities or end recesses 139 between the outer ends of adjacent channel semiconductor material layers 106. Then, a conformal deposition process, such as an ALD process, was performed to form a layer of insulating spacer material (e.g., silicon nitride) so as to substantially fill the inner spacer recesses 139. Thereafter, an isotropic etch process was performed to remove any excess amounts of the insulating spacer material outside of the inner spacer cavities and thereby define inner spacers 140 positioned within the end recesses 139. Note that the inner spacers 140 are substantially self-aligned with respect to the sidewall spacers 114. The inner spacers 140 may be made of a variety of different materials, e.g., silicon nitride, SiBNC, SiNC, SiN, SiCO, and SiNOC, etc. In one particularly illustrative embodiment, the inner spacers 140 may be made of a material (e.g., silicon nitride) that exhibits good etch selectivity relative to the materials of the sidewall spacers 114 (e.g., SiBCN), the gate caps 112 (e.g., SiBCN) and the conformal layer of isolation material 128 (e.g., SiBCN).

With continuing reference to FIG. 14, after the formation of the inner spacers 140, an epitaxial growth process was performed to form epi source/drain regions 142 for the devices 100. Note that the device isolation material 128 comprises a pillar portion 128A that is positioned under each of the source/drain regions 142, wherein an upper surface 128AS of the pillar regions 128A is positioned above the surface 128S of the device isolation material 128 that is positioned under the gate structures of the devices 100 by a distance 128H. Stated another way, the upper surface 128AS of the pillars 128A is positioned a distance 128H above the bottom surface of the final gate structures 146 of the devices 100. The layer 106A and the channel semiconductor material layers 106B-D serve as growth surfaces or seed areas during this epi growth process. The epi source/drain regions 142 may be comprised of the same semiconductor material as that of the channel semiconductor material layers 106 (e.g., silicon) or they may be comprised of a different material, such as, for example, SiGe. The epi source/drain regions 142 may be doped in situ with the appropriate dopant type (N or P) depending upon the type of device (N or P) under construction. Then, conductive trench silicide structures (not shown) were formed on the upper surfaces of the epi source/drain regions 142 by performing known process operations. Next, a layer of insulating material 143 was blanket-deposited on the product so as to over-fill the spaces above the epi source/drain regions 142 between the adjacent gate structures 110. At that point, one or more CMP processes were performed using the gate caps 112 as a polish stop layer so as to remove excess amounts of the insulating material 143.

Note that the pillar structures 128A (measured at their upper surface 128AS) have a lateral width 128 W that is less than the lateral width 142 W of the source/drain region 142 positioned above the pillar 128A, wherein the lateral width of the source/drain region 142 is measured at mid-height level of the source/drain region 142 relative to the upper surface 128S of the device isolation material 128. Also note that the pillar 128A has a vertical height 128H (relative to the upper surface 128S of the device isolation material 128) that is less than a vertical distance 152 from the upper surface 128S of the device isolation material 128 to the bottom surface of the lowermost channel semiconductor layer 106B.

As mentioned above, in the illustrative example depicted herein, the final gate structure for the devices 100 will be manufactured using replacement gate manufacturing techniques. Accordingly, with continuing reference to FIG. 14, at least one CMP process was performed to remove the gate caps 112 and a vertical portion of the spacers 114 so as to thereby expose the sacrificial gate structures 110. Then, one or more etching processes were performed to remove the exposed sacrificial gate structures 110. These process operations result in the formation of a plurality of replacement gate cavities 144 in the area between the spacer 114 for each of the devices 100. Removal of the sacrificial gate structures 110 also exposes portions of the second sacrificial material layers 108 and the channel semiconductor material layers 106 within the replacement gate cavities 144. Next, an isotropic etching process was performed through the replacement gate cavities 144 so as to selectively remove the remaining portions of the second sacrificial material layers 108 relative to the channel semiconductor material layers 106 and the surrounding materials.

Still referencing FIG. 14, in one illustrative embodiment, a thinning or trimming process was performed on the channel semiconductor material layers 106 through the replacement gate cavities 144 so as to reduce the thickness of at least a portion of the channel semiconductor material layers 106 exposed within the replacement gate cavities 144. More specifically, this process operation reduces the thickness of the affected portions of the channel semiconductor material layers 106 from their initial thickness to a reduced final thickness 106X. The amount of trimming performed on the channel semiconductor material layers 106 may vary depending upon the particular application. Note that, due to the fact that the layer 106A was formed with a lesser initial thickness than that of the channel semiconductor material layers 106B-D, the trimming process removes substantially all of the layer 106A within the areas defined by the gate cavities 144. Reducing the size or thickness of the channel semiconductor material layers 106B-D has the effect of creating relatively larger spaces between the thinned channel semiconductor material layers 106B-D where the gate materials will be formed for the final gate structures of the devices 100.

FIG. 14 further depict the devices 100 after a simplistically depicted replacement (final) gate structure 146 and a final gate cap 148 were formed in each of the replacement gate cavities 144. As depicted, the final gate structures 146 are positioned around the thinned channel semiconductor material layers 108B-D. Typically, the materials for the final gate structures 146 are sequentially formed in the replacement gate cavities 144. For example, with reference to FIG. 14, a first conformal deposition process may be performed to form a gate insulation layer (not separately shown) across the product and within the replacement gate cavities 144 and on and between the now-trimmed channel semiconductor material layers 108B-D. Thereafter, one or more deposition processes were performed to form one or more conductive materials (not separately shown) in the replacement gate cavities 144 so as to collectively form a conductive gate electrode of the final gate structure 146. For example, in one embodiment, a second conformal deposition process may be performed to form a conformal work function adjusting metal layer (not separately shown) across the product and on the gate insulation layer within the replacement gate cavities 144. In some applications, additional conformal conductive material layers may be formed in the replacement gate cavities 144. Next, a blanket deposition process may be performed to form a bulk conductive material (not separately shown), e.g., tungsten, aluminum, polysilicon, etc. on the work function adjusting metal layer so as to over-fill the remaining un-filled portion of the replacement gate cavities 144. Thereafter, one or more CMP processes may be performed so as to remove excess portions of the gate insulation layer and the conductive materials of the conductive gate electrode that are positioned above the layer of insulating material 143 and outside of the replacement gate cavities 144.

At that point, one or more recess etching processes were performed to recess the vertical height of the materials of the final gate structures 146 within the replacement gate cavities 144 so as to make room (in a vertical sense) for the final gate caps 148. The final gate caps 148 may be formed by blanket depositing a layer of the material for the final gate caps 148 above the devices 100 and in the space above the recessed gate structures 146 within the replacement gate cavities 144. Then, another CMP process may be performed using the layer of insulating material 143 as a polish-stop so as to remove excess amounts of the material for the final gate caps 148. At this point in the processing, the final gate structure 146 with the final gate cap 148 has been formed on each of the nano-sheet devices 100. Of course, the materials of construction for the final gate structure 146 may vary depending upon whether the device is an N-type device or a P-type device. Additionally, the final gate structure 146 may have a different number of layers of material depending upon the type of device under construction, e.g., the final gate structure 146 for an N-type device may comprise more layers of conductive material than are present in a final gate structure 146 for a P-type device. The gate insulation layer may be comprised of a variety of different materials, such as, for example, silicon dioxide, a so-called high-k (k greater than 10) insulation material (where k is the relative dielectric constant), etc. The work function adjusting metal layer may be comprised of a variety of different materials, e.g., titanium nitride, TiC, TiAlC, W, Al, etc., depending upon the type of device (N or P) being manufactured. The final gate cap 148 may be made of a variety of different materials, e.g., silicon nitride, SiCN, SiN/SiCN, SiOC, SiOCN, etc. Lastly, a plurality of simplistically depicted conductive source/drain contact structures 150 may be formed in the layer of insulating material 143 using known processing techniques.

Figure 15:
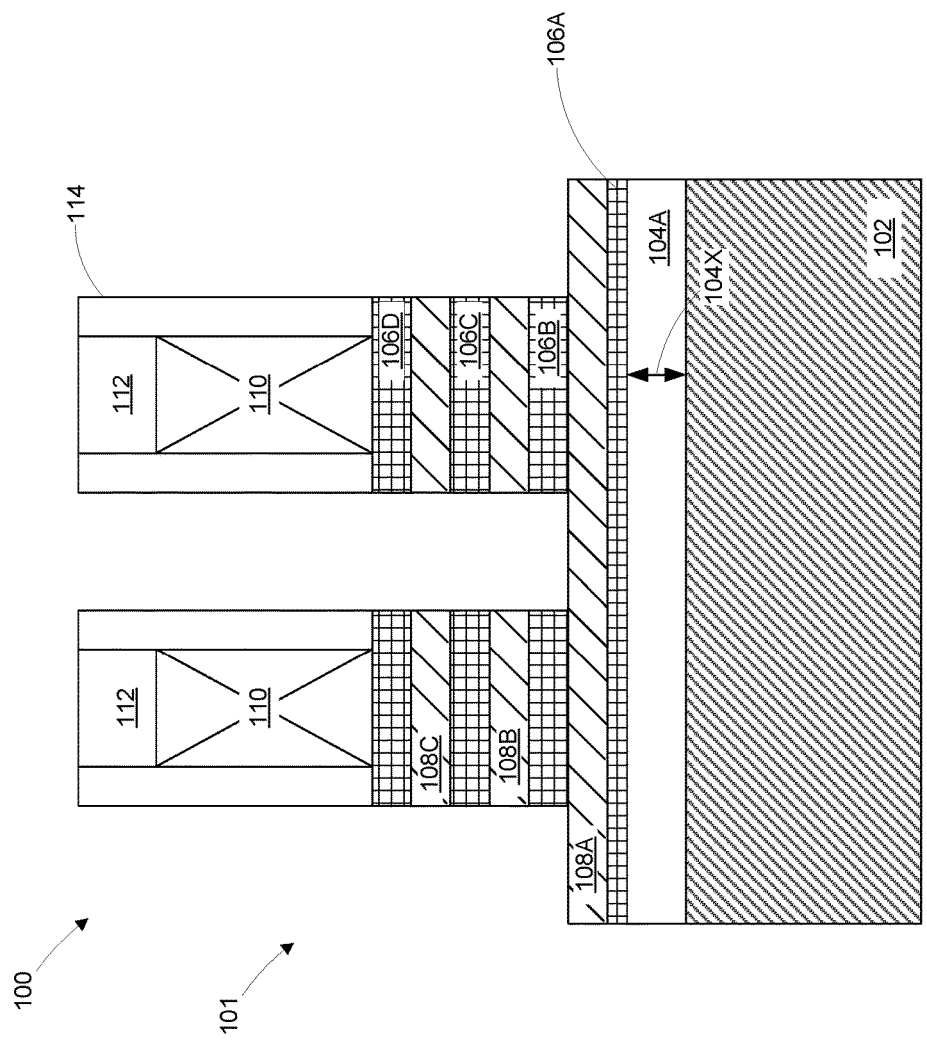
FIGS. 15-16 depict other novel methods disclosed herein of forming an isolated nano-sheet transistor device and the resulting novel device.
Figure 16:
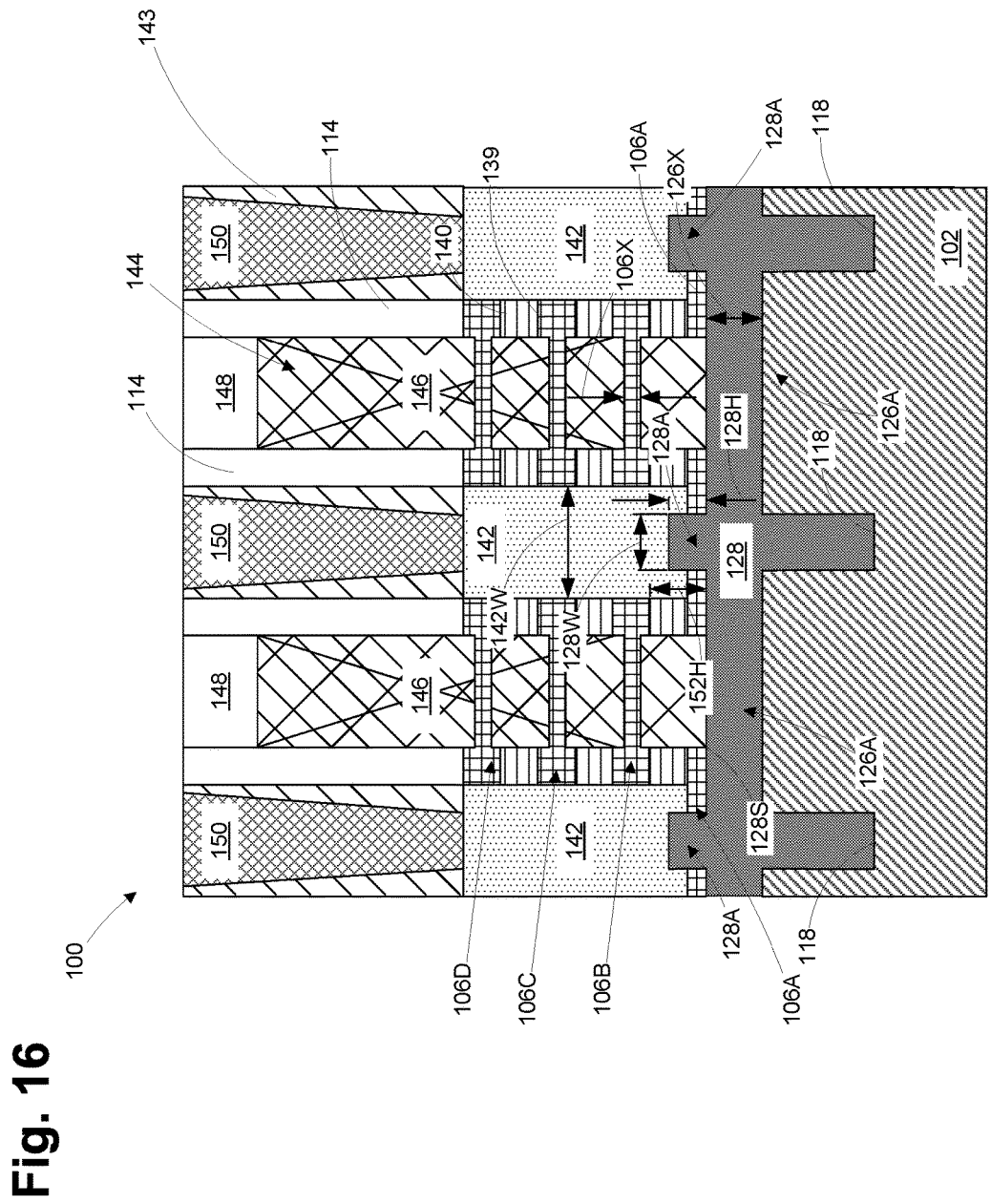

FIGS. 15-16 depict other novel methods disclosed herein of forming an isolated nano-sheet transistor device and the resulting novel device. In this embodiment, relative to the embodiment previously described, the devices 100 are manufactured using a relatively thinner layer of first sacrificial material 104A as compared to the relatively thicker layer of first sacrificial material 104 discusses above. As a result, in this embodiment, the empty spaces 126A formed under the devices 100 were formed with a lesser vertical thickness 126X as compared to the vertical thickness 126T of the spaces 126 that were formed using the relatively thicker layer of first sacrificial material 104.

Accordingly, FIG. 15 depicts the devices 100 at a point in processing that corresponds to the processing depicted in FIG. 4. However, in this embodiment, the layer of first sacrificial material 104 has been replaced with a relatively thinner layer of first sacrificial material 104A having an initial thickness 104X that is equal to or less than the width 124 of the bottom opening 119. In this embodiment, as before, the layer of first sacrificial material 104A was removed to define a plurality of spaces 126A having a vertical thickness 126X, wherein the vertical thickness 126X corresponds approximately to the initial thickness 104X of the layer of first sacrificial material 104A. In this embodiment, when the above-described conformal layer of device isolation material 128 is formed across the product, it will substantially fill the empty spaces 126A due to their relatively smaller vertical thickness as compared to the previous embodiment. That is, in one embodiment, the spaces 126A may be substantially free of any significant air gaps, like the air gaps 129 previously described. As before, due to the relatively narrow lateral width 124 of the lower opening 119 portion of the stepped opening 120 as compared to the wider width 122 of the upper opening 121, the material of the conformal layer of isolation material 128 will "pinch off" (or fill) the lower opening 119 portion of the stepped opening 120 while the conformal layer of isolation material 128 retains its substantially conformal configuration and does not fill, to any significant extent, the upper opening 121. As a result, substantially continuous regions of isolation material 128 are formed under the channel regions of the devices 100. In general, if the initial thickness 104X of the layer of first sacrificial material layer 104A is equal to or less than the lateral width 124, then the conformal layer of isolation material 128 will substantially fill the spaces 126A under the devices 100.

Figure 17:
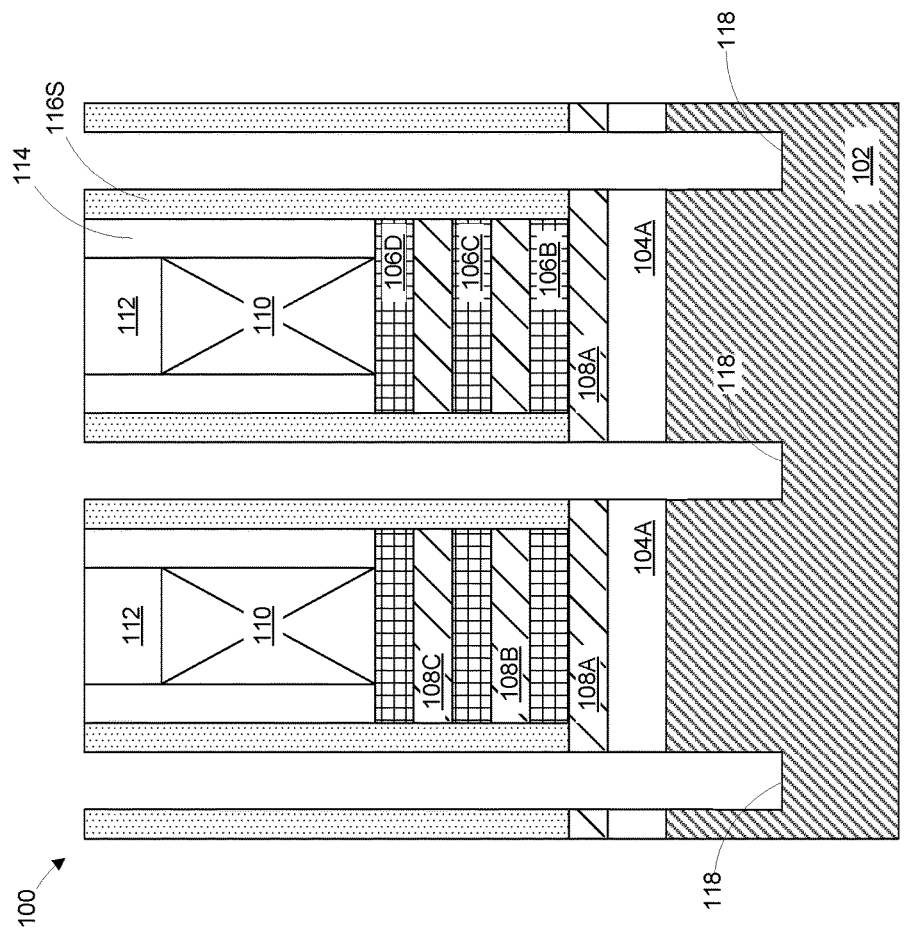
FIGS. 17-23 depict yet other novel methods disclosed herein of forming an isolated nano-sheet transistor device and the resulting novel device.

FIGS. 17-23 depict yet other novel methods disclosed herein of forming an isolated nano-sheet transistor device and the resulting novel device. FIG. 17 depicts the devices 100 at a point in processing that corresponds to the processing depicted in FIG. 7. However, in this embodiment, relative to the embodiment previously described above in FIGS. 2-14, the layer 106A has been omitted and the above-described relatively thinner layer of first sacrificial material 104A is used as compared to the relatively thicker layer of first sacrificial material 104 discussed above. As a result, in this embodiment, the empty spaces 126A under the devices 100 were formed with a lesser vertical thickness 126X as compared to the vertical thickness 126T of the spaces 126 that were formed using the relatively thicker layer of first sacrificial material 104 (see FIG. 19).

Figure 18:
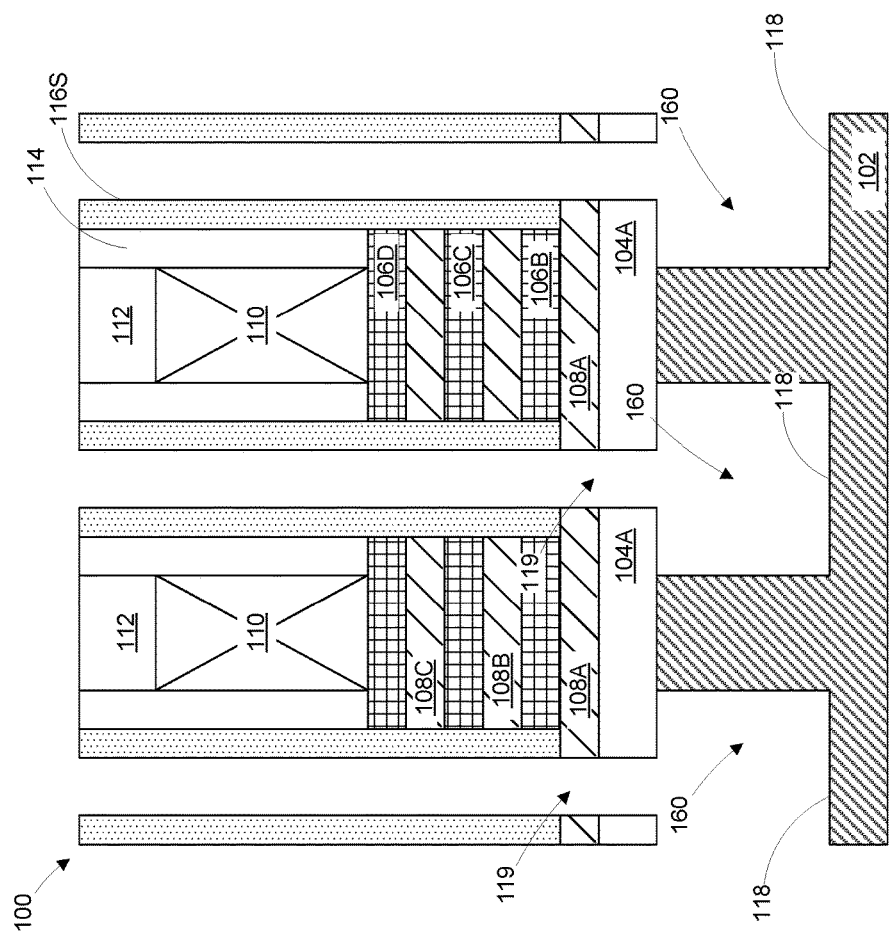

FIG. 18 depicts the devices 100 wherein, after an etching process was performed to initially define the trenches 118 in the substrate 102 (see FIG. 17), an isotropic etching process was performed on the substrate 102 to increase the physical size of the original trenches 118, i.e., to increase both the lateral width and vertical depth of the original trenches 118. This process operation results in the formation of a plurality of larger trenches 160 in the substrate 102. The lateral width and vertical depth of the trenches 160 may vary depending upon the particular application. In one illustrative example, the trenches 160 may have a lateral width of about 15-25 nm and a vertical thickness of about 5-50 nm.

Figure 19:
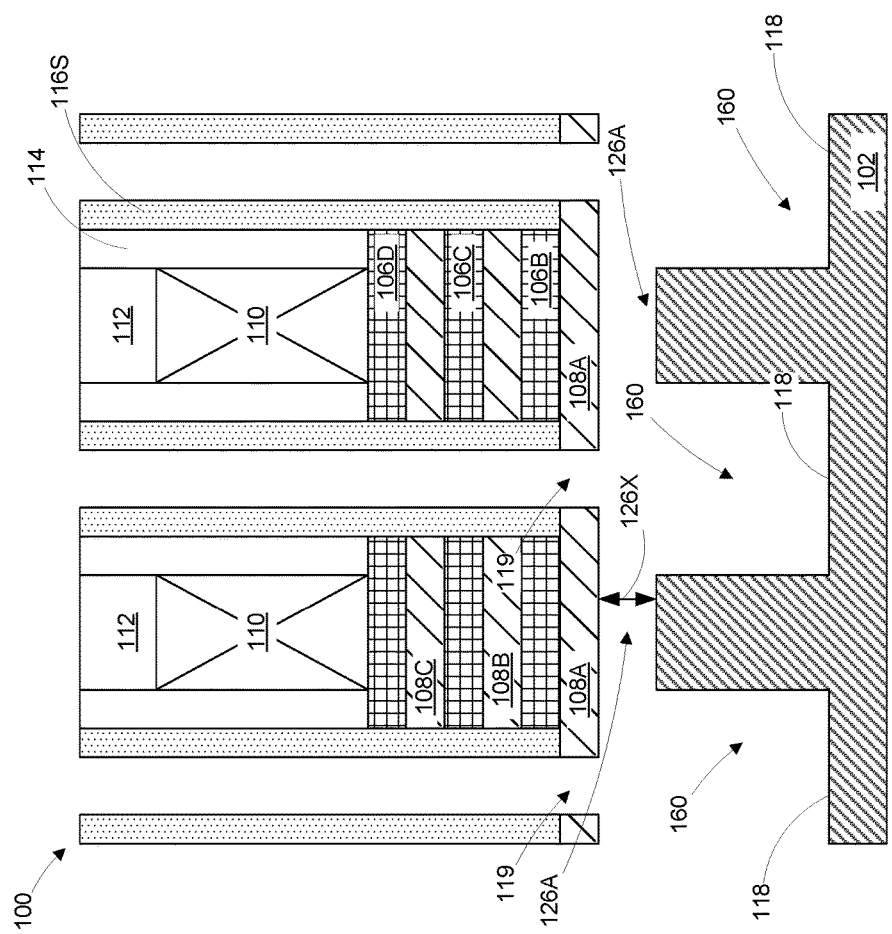

FIG. 19 depicts the devices 100 after a selective isotropic etching process was performed thorough the openings 119 in the lowermost second sacrificial material layer 108A to selectively remove substantially all of the first sacrificial material layer 104A relative to the surrounding materials, including the lowermost second sacrificial material layer 108A. This process operation results in the formation of the above-described spaces 126A (with a smaller vertical thickness 126X) that extend laterally under the channel materials 106 of each of the devices 100 in both the gate length (GL) direction (shown in FIG. 19) and the gate width direction (GW) of the devices 100. As depicted, the spaces 126A have a thickness or height 126X that corresponds to the initial thickness 104X of the first sacrificial material layer 104A. Also note that the spaces 126A are in communication with the larger trenches 160 previously defined in the substrate 102.

Figure 20:
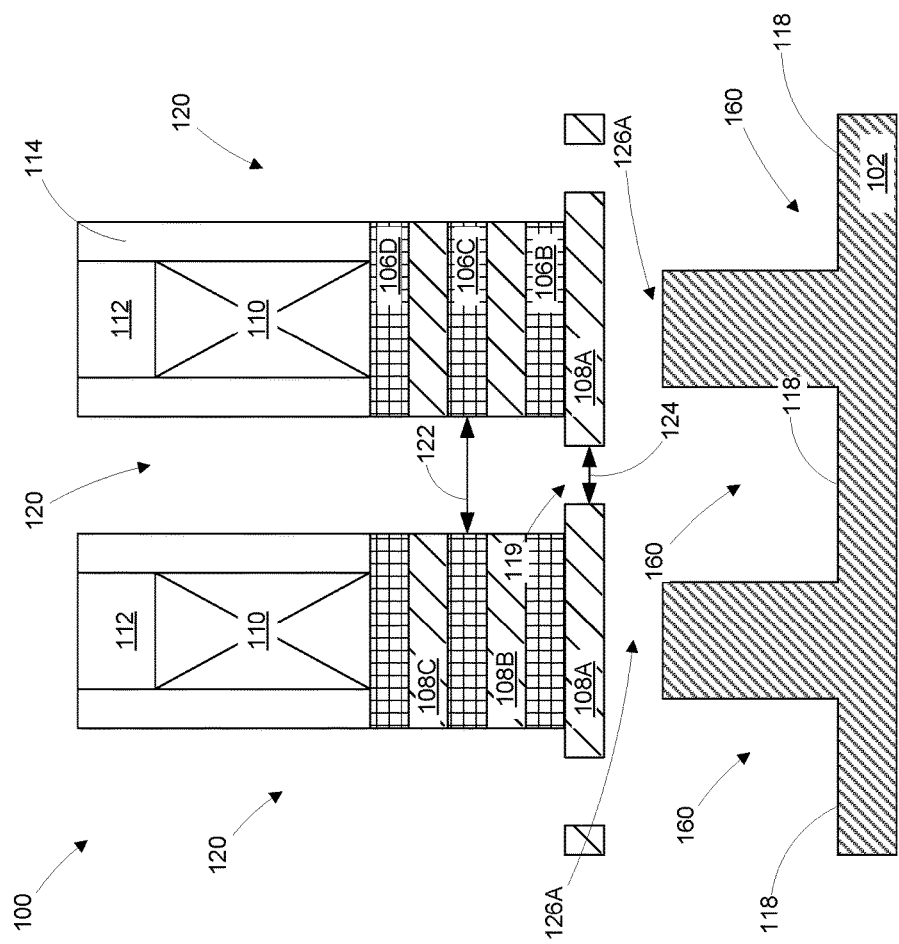

FIG. 20 depicts the devices 100 after the above-described etching process was performed to selectively remove the sacrificial spacers 116S relative to the surrounding materials so as to form the stepped opening 120 described above. However, in this embodiment, the lower opening 119 only extends through the lowermost second sacrificial material layer 108A.

Figure 21:
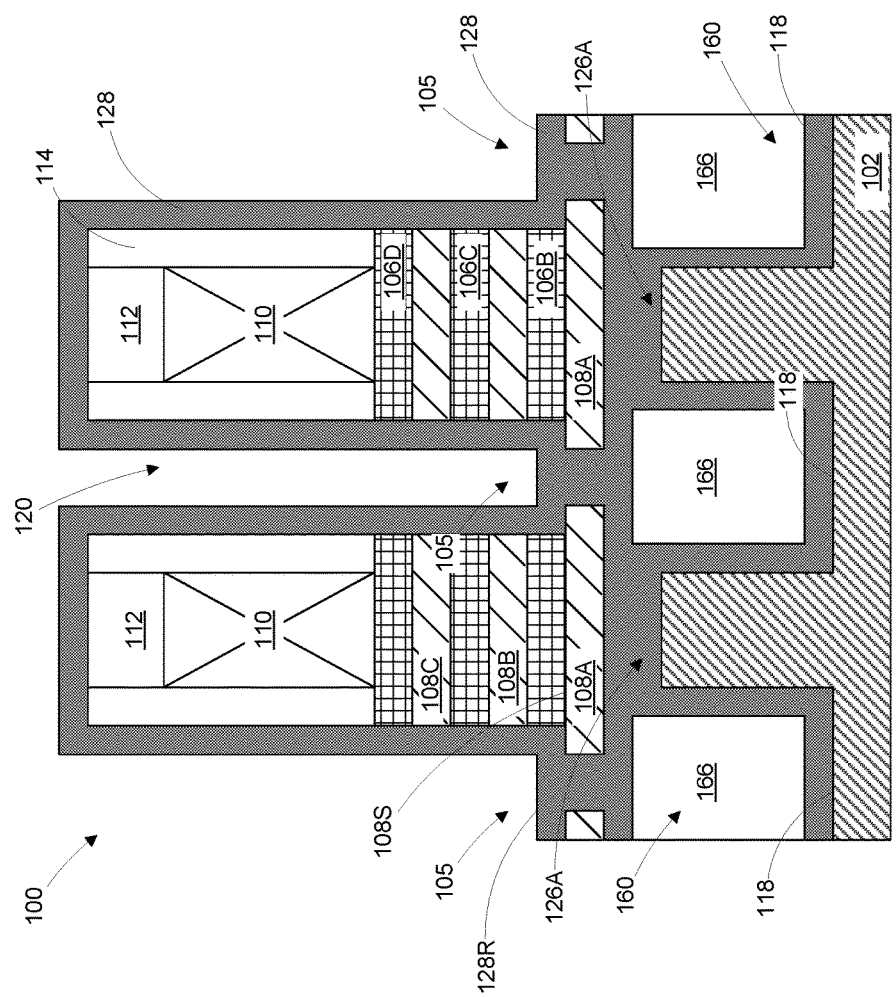

FIG. 21 depicts the devices 100 after the above-described conformal layer of device isolation material 128 was formed across the product, in the spaces or cavities 126A between the devices and the substrate 102. As depicted, the isolation material 128 substantially fills the portions of the spaces 126A located vertically between the upper surface of the substrate 102 and the bottom surface of the lowermost second sacrificial material layer 108A. However, in this embodiment, due to the formation of the relatively larger trenches 160 in the substrate 102, the conformal layer of device isolation material 128 forms conformally within the trenches 160, thereby defining a plurality of air gaps 166. The air gaps 166 are generally positioned under the area 105 between the spacers 114 on adjacent gate structures, i.e., the air gaps 166 are generally positioned under the area 105 where the source/drain regions 142 will be formed for the devices 100. The physical size of the air gaps 166 and their physical configuration may vary depending upon the particular application. The physical size of the air gaps 166 (in both vertical and lateral directions) depends, to at least some degree, upon the physical size of the enlarged trenches 160. Note that, as before, due to the relatively narrow lateral width 124 of the lower opening 119 portion of the stepped opening 120 as compared to the wider width 122 of the upper opening 121, the material of the conformal layer of isolation material 128 will "pinch off" (or fill) the lower opening 119 portion of the stepped opening 120 while the conformal layer of isolation material 128 retains its substantially conformal configuration and does not fill, to any significant extent, the upper opening 121.

Figure 22:
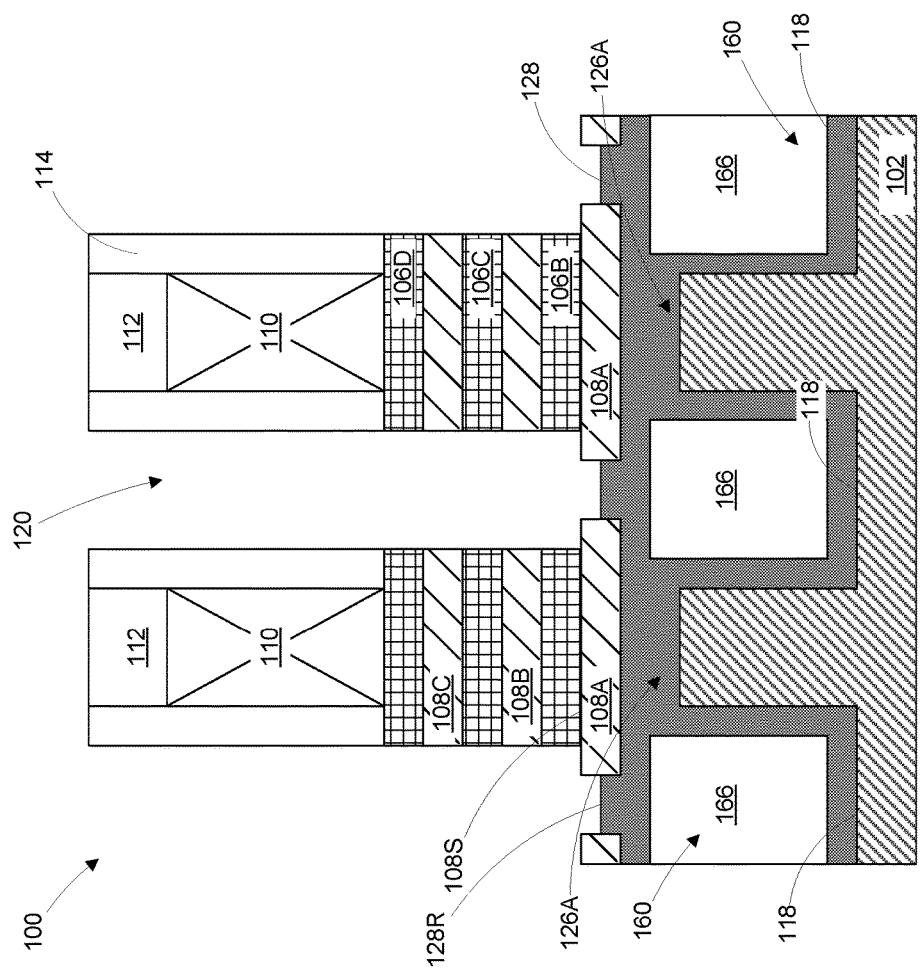

FIG. 22 depicts the devices 100 after the above-described timed, isotropic recess etching process was performed to recess the conformal layer of device isolation material 128 so it has a recessed upper surface 128R that is positioned at a level that is below the level of the upper surface 108S of the lowermost second sacrificial material layer 108A. As before, the amount of recessing of the conformal layer of isolation material 128 may vary depending upon the particular application. As depicted, performing the processing flow described above results in the formation of a plurality of fully isolated nano-sheet devices 100 in that substantially continuous regions of isolation material 128 are positioned under the devices 100 and between the substrate 102, with the air gaps 166 being formed in the trenches 160 in the substrate 102 in areas below where source/drain regions of the devices 100 will be formed.

Figure 23:
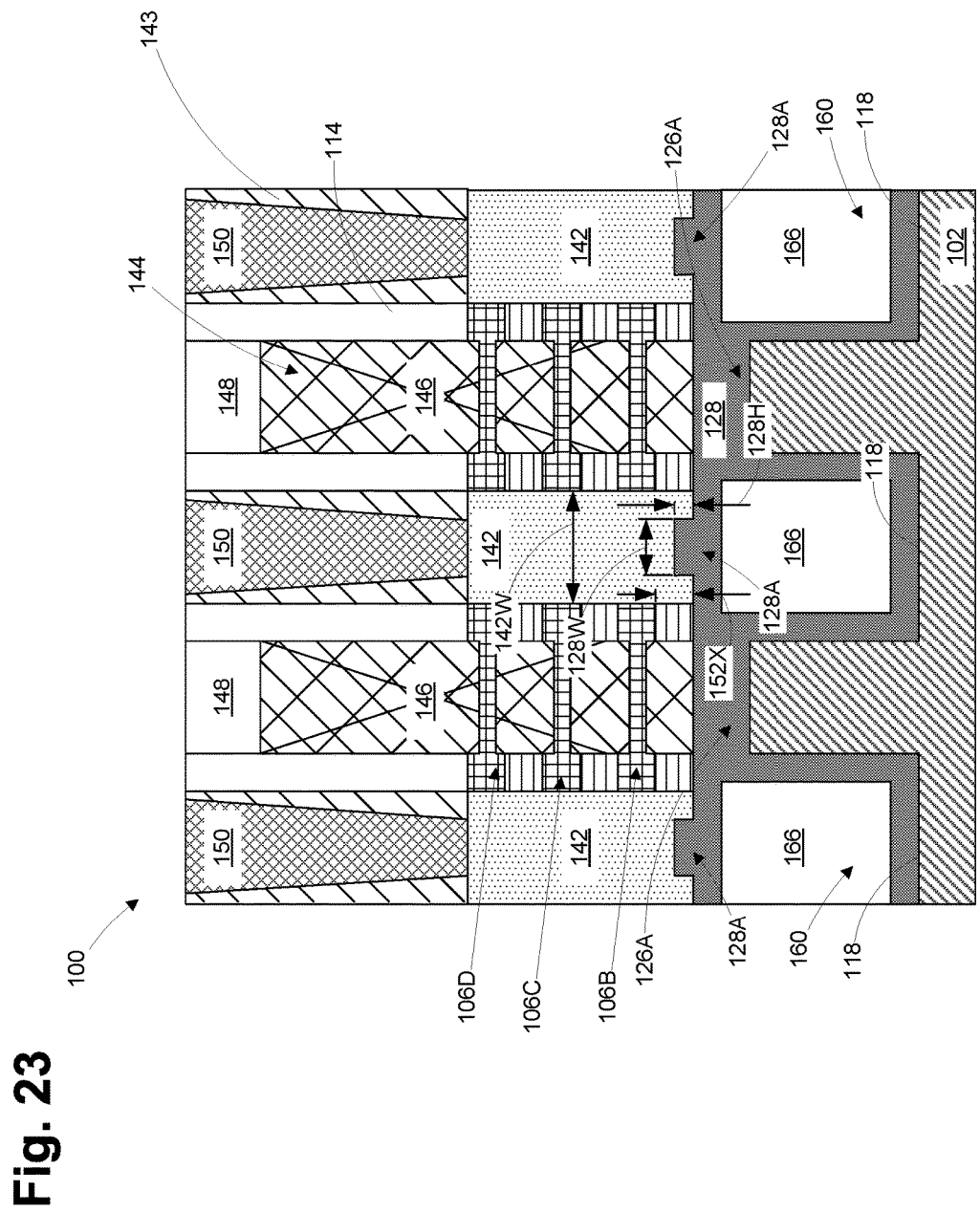

At the point of processing depicted in FIG. 22, various additional manufacturing techniques described above may be performed to complete the devices 100. Accordingly, FIG. 23 depicts the devices 100 after several operations were performed to substantially complete the formation of the devices 100. First, the above-described anisotropic etching process was performed to remove the portions of the lowermost second sacrificial material layer 108A. Thereafter, the above-described timed isotropic etching process was performed to partially recess the lateral width of all of the second sacrificial material layers 108 selectively relative to the channel semiconductor material layers 106 so as to define the inner spacer cavities or end recesses 139. Thereafter, the above-described process operations were performed to form the above-described inner spacers 140 within the end recesses 139.

With continuing reference to FIG. 23, after the formation of the inner spacers 140, an epitaxial growth process was performed to form the above-described epi source/drain regions 142 for the devices 100. Note that the device isolation material 128 comprises the above-described pillar portions 128A that are positioned under each of the source/drain regions 142. Then, conductive trench silicide structures (not shown) were formed on the upper surfaces of the epi source/drain regions 142. Next, the above-described layer of insulating material 143 was blanket-deposited on the product so as to over-fill the spaces above the epi source/drain regions 142 between the adjacent gate structures 110. At that point, one or more CMP processes were performed using the gate caps 112 as a polish stop layer so as to remove excess amounts of the insulating material 143.

Still referencing FIG. 23, the devices were completed by removing the sacrificial gate structure 110 so as to define the above-described replacement gate cavities 144. At that point, the above-described thinning or trimming process was performed on the channel semiconductor material layers 106 through the replacement gate cavities 144 so as to reduce the thickness of at least a portion of the channel semiconductor material layers 106 exposed within the replacement gate cavities 144. Next, the above-described replacement (final)

gate structures 146 and final gate caps 148 were formed in the replacement gate cavities 144. Lastly, a plurality of simplistically depicted conductive source/drain contact structures 150 may be formed in the layer of insulating material 143 using known processing techniques.

As will be appreciated by those skilled in the art after a complete reading of the present application, various novel methods and nano-sheet devices are disclosed herein. For example, one illustrative method involves, among other things, forming a sacrificial gate and a stack of materials above a semiconductor substrate, wherein the sacrificial gate is positioned above the stack of materials and wherein the stack of materials comprises at least one channel semiconductor material layer and a plurality of first layers of a sacrificial material, and then forming a trench in each of the source/drain areas of the device, wherein each trench extends into the semiconductor substrate. In this example, the method may also include forming an empty space under the sacrificial gate structure, the empty space being vertically positioned between the stack of materials and the semiconductor substrate, wherein the empty space is in communication with the trenches, performing a conformal deposition process so as to deposit a conformal layer of a device isolation material adjacent at least the sacrificial gate while at least partially filling the empty space with the device isolation material and substantially filling the trenches with the device isolation material, and performing a recess etching process to remove at least portions of the conformal layer of the device isolation material positioned adjacent the sacrificial gate, thereby defining a recessed upper surface of the device isolation material.

In further examples, the conformal deposition process is performed so as to fill substantially an entirety of the empty space with the device isolation material. In another example, the conformal deposition process is performed so as to substantially fill an entirety of each of the trenches with the device isolation material and partially fill the empty space with the device isolation material so as to form an air gap within the empty space, wherein at least a portion of the air gap is positioned vertically below at least a portion of the sacrificial gate. In yet another example, the conformal deposition process is performed so as substantially fill an entirety of each of the trenches with the device isolation material and substantially fill an entirety of the empty space with the device isolation material. In an even further example another method disclosed herein involves, after forming the trenches in each of the source/drain areas, performing an isotropic etching process on the substrate so as to increase a lateral width and a vertical depth of the trenches and thereby define a plurality of enlarged trenches within the substrate below the source/drain areas and then performing the conformal deposition process so as substantially fill an entirety of the empty space with the device isolation material and partially fill each of the enlarged trenches with the device isolation material so as to form an air gap within each of the enlarged trenches. Of course, other methods and devices are disclosed herein and will be more specifically set forth in the appended claims.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a nano-sheet transistor comprising source/drain areas where source/drain regions will be formed, the method comprising:

forming a sacrificial gate and a stack of materials above a semiconductor substrate, wherein said sacrificial gate is positioned above said stack of materials and wherein said stack of materials comprises at least one channel semiconductor material layer and a plurality of first layers of a sacrificial material;

forming a trench in each of said source/drain areas, wherein each trench extends into said semiconductor substrate;

forming an empty space under said sacrificial gate, said empty space being vertically positioned between said stack of materials and said semiconductor substrate, said empty space being in communication with said trenches;

performing a conformal deposition process so as to deposit a conformal layer of a device isolation material adjacent at least said sacrificial gate while at least partially filling said empty space with said device isolation material and substantially filling said trenches with said device isolation material; and performing a recess etching process to remove at least portions of said conformal layer of said device isolation material positioned adjacent said sacrificial gate, thereby defining a recessed upper surface of said device isolation material.

2. The method of claim 1, wherein performing said conformal deposition process comprises performing said conformal deposition process so as to fill substantially an entirety of said empty space with said device isolation material.

3. The method of claim 1, wherein performing said conformal deposition process comprises performing said conformal deposition process so as to substantially fill an entirety of each of said trenches with said device isolation material and partially fill said empty space with said device isolation material so as to form an air gap within said empty space, wherein at least a portion of said air gap is positioned vertically below at least a portion of said sacrificial gate.

4. The method of claim 1, wherein performing said conformal deposition process comprises performing said conformal deposition process so as to substantially fill an entirety of each of said trenches with said device isolation material and substantially fill an entirety of said empty space with said device isolation material.

5. The method of claim 1, further comprising, after forming said trenches in each of said source/drain areas, performing an isotropic etching process on said semiconductor substrate so as to increase a lateral width and a vertical depth of said trenches and thereby define a plurality of enlarged trenches within said semiconductor substrate below said source/drain areas, and wherein performing said conformal deposition process comprises performing said conformal deposition process so as to substantially fill an entirety of said empty space with said device isolation material and partially fill each of said enlarged trenches with said device isolation material so as to form an air gap within each of said enlarged trenches.

6. The method of claim 5, wherein, after forming said trenches in each of said source/drain areas, the method further comprises performing an epitaxial deposition process to form epi source/drain regions in each of said source/drain areas, each of said source/drain regions being positioned above said air gap in said enlarged trench.

7. The method of claim 1, wherein forming said sacrificial gate comprises forming a sacrificial gate structure with a gate cap positioned above said sacrificial gate structure and forming a sidewall spacer adjacent said sacrificial gate structure and said gate cap.

8. A method of forming a nano-sheet transistor comprising source/drain areas where source/drain regions will be formed, the method comprising:
   forming a sacrificial gate above a fin-like configured stack of materials, said sacrificial gate comprising a sacrificial gate structure with a gate cap positioned above said sacrificial gate structure and a sidewall spacer positioned adjacent said sacrificial gate structure and said gate cap, said stack of materials comprising a first layer of a first sacrificial material positioned above a semiconductor substrate, at least one channel semiconductor material layer and a plurality of second layers of a second sacrificial material, wherein a lowermost of said plurality of second layers is positioned between said first layer and a lowermost of said at least one channel semiconductor material layer;
   patterning all of said layers in said stack of materials above said lowermost of said plurality of second layers using said sacrificial gate as an etch mask while leaving said lowermost of said plurality of second layers in position above said source/drain areas;
   forming a trench in each of said source/drain areas, wherein each trench extends from a first opening in said lowermost of said plurality of second layers and into said semiconductor substrate, said first layer being exposed within each trench;
   performing an isotropic etching process through said first opening to selectively remove substantially all of said first layer and thereby define an empty space located above said semiconductor substrate and below said lowermost of said plurality of second layers and said sacrificial gate, said empty space being in communication with said trenches;
   performing a conformal deposition process so as to deposit a conformal layer of a device isolation material adjacent at least said sacrificial gate while at least partially filling said empty space with said device isolation material and substantially filling said first opening with said device isolation material; and
   performing a recess etching process to remove at least portions of said conformal layer of said device isolating material positioned above said first opening and thereby define a recessed upper surface of said device isolation material.

9. The method of claim 8, wherein performing said conformal deposition process comprises performing said conformal deposition process so as to fill substantially an entirety of said empty space with said device isolation material.

10. The method of claim 8, wherein performing said conformal deposition process comprises performing said conformal deposition process so as to substantially fill an entirety of each of said trenches with said device isolation material and partially fill said empty space with said device isolation material so as to form an air gap within said empty space, wherein at least a portion of said air gap is positioned vertically below at least a portion of said sacrificial gate.

11. The method of claim 8, wherein performing said conformal deposition process comprises performing said conformal deposition process so as to substantially fill an entirety of each of said trenches with said device isolation material and substantially fill an entirety of said empty space with said device isolation material.

12. The method of claim 8, further comprising, after forming said trenches in each of said source drain areas, performing an isotropic etching process through said first opening in said semiconductor substrate so as to increase a lateral width and a vertical depth of said trenches and thereby define a plurality of enlarged trenches within said semiconductor substrate below said source drain areas, and wherein performing said conformal deposition process comprises performing said conformal deposition process so as to substantially fill an entirety of said empty space with said device isolation material and partially fill each of said enlarged trenches with said device isolation material so as to form an air gap within each of said enlarged trenches.

13. The method of claim 8, wherein said first layer has a thickness that is less than or equal to a lateral width of said first opening in a gate length direction of said device.

14. The method of claim 8, wherein said first layer has a thickness that is greater than a lateral width of said first opening in a gate length direction of said device.

15. The method of claim 8, wherein, after performing said recess etching process, the method further comprises performing at least one etching process to remove at least said portions of said lowermost of said plurality of second layers that are positioned above said source/drain areas so as to thereby expose a portion of a pillar comprised of said device isolation material in each of said source/drain regions, wherein each pillar has an upper surface that is positioned at a level that is above a level of an upper surface of said device isolation material positioned in said empty space.

16. The method of claim 15, further comprising performing an epitaxial deposition process to form epi source/drain regions in each of said source/drain areas, each of said source/drain regions being positioned above and around a portion of said pillar.

17. The method of claim 16, wherein said pillar has a lateral width in a gate length direction of said device as measured at an upper surface of said pillar that is less than a lateral width of said epi source/drain regions as measured at a midpoint of said epi source/drain regions.

18. The method of claim 8, wherein, prior to forming said trenches in each of said source/drain areas, the method further comprises:
   forming a sacrificial sidewall spacer adjacent said sidewall spacer of said sacrificial gate; and
   performing an etching process using said sacrificial sidewall spacer as a portion of an etch mask so as to remove at least portions of said lowermost of said plurality of second layers positioned above said source/drain areas.

19. A method of forming a nano-sheet transistor comprising source/drain areas where source/drain regions will be formed, the method comprising:
   forming a sacrificial gate above a fin-like configured stack of materials, said sacrificial gate comprising a sacrificial gate structure with a gate cap positioned above said sacrificial gate structure and a sidewall spacer positioned adjacent said sacrificial gate structure and said gate cap, said stack of materials comprising a first layer of a first sacrificial material positioned above a semiconductor substrate, at least one channel semiconductor material layer and a plurality of second layers of a second sacrificial material, wherein a lowermost of said plurality of second layers is positioned between said first layer and a lowermost of said at least one channel semiconductor material layer;

patterning all of said layers in said stack of materials above said lowermost of said plurality of second layers using said sacrificial gate as an etch mask while leaving said lowermost of said plurality of second layers in position above said source/drain areas;

forming a sacrificial sidewall spacer adjacent said sidewall spacer of said sacrificial gate and above portions of said lowermost of said plurality of second layers positioned above said source/drain areas;

performing an etching process using said sacrificial sidewall spacer as a portion of an etch mask so as to remove at least portions of said lowermost of said plurality of second layers positioned above said source/drain areas;

with said sacrificial sidewall spacer in position, performing at least one etching process to form a trench in each of said source/drain areas, wherein each trench extends form a first opening in said lowermost of said plurality of second layers and into said semiconductor substrate, said first layer being exposed within each trench;

performing an isotropic etching process through said first opening to selectively remove substantially all of said first layer and thereby define an empty space located above said semiconductor substrate and below said lowermost of said plurality of second layers, said empty space being in communication with said trenches;

performing a conformal deposition process so as to deposit a conformal layer of a device isolation material adjacent at least said sacrificial gate while at least partially filling said empty space with said device isolation material and substantially filling said first opening with said device isolation material; and performing a recess etching process to remove at least portions of said conformal layer of said device isolation material positioned above said first opening and thereby define a recessed upper surface of said device isolation material.

20. The method of claim 19, wherein, after performing said recess etching process the method further comprises:

performing at least one etching process to remove at least said portions of said lowermost of said second layers that are positioned above said source/drain areas so as to thereby expose a portion of a pillar comprised of said device isolation material in each of said source/drain regions, wherein each pillar has an upper surface that positioned at a level that is above a level of an upper surface of said device isolation material positioned in said empty space; and performing an epitaxial deposition process to form epi source/drain regions in each of said source/drain areas, each of said source/drain regions being positioned above and around a portion of said pillar.

\* \* \* \* \*